(12) United States Patent
Suganuma et al.

(10) Patent No.: US 12,396,361 B2
(45) Date of Patent: Aug. 19, 2025

(54) IMAGING DEVICES AND IMAGING APPARATUSES

(71) Applicant: Samsung Electronics Co., Ltd., Suwon-si (KR)

(72) Inventors: Naotoshi Suganuma, Yokohama (JP); Chul Joon Heo, Busan (KR); Kyung Bae Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1125 days.

(21) Appl. No.: 17/186,641

(22) Filed: Feb. 26, 2021

(65) Prior Publication Data

US 2021/0273188 A1   Sep. 2, 2021

(30) Foreign Application Priority Data

Feb. 28, 2020 (JP) ................................ 2020-034248
Feb. 25, 2021 (KR) ........................ 10-2021-0025996

(51) Int. Cl.
*H10K 85/60* (2023.01)
*H10K 30/20* (2023.01)
*H10K 39/32* (2023.01)
*H10K 85/40* (2023.01)

(52) U.S. Cl.
CPC ......... *H10K 85/615* (2023.02); *H10K 30/211* (2023.02); *H10K 39/32* (2023.02); *H10K 85/40* (2023.02); *H10K 85/626* (2023.02); *H10K 85/649* (2023.02); *H10K 85/654* (2023.02); *H10K 85/657* (2023.02); *H10K 85/6572* (2023.02); *H10K 85/6574* (2023.02); *H10K 85/6576* (2023.02)

(58) Field of Classification Search
None
See application file for complete search history.

(56) References Cited

U.S. PATENT DOCUMENTS

| 7,687,761 B2 | 3/2010 | Goto |
| 8,525,577 B2 | 9/2013 | Yofu et al. |
| 9,070,887 B2 | 6/2015 | Yofu et al. |

(Continued)

FOREIGN PATENT DOCUMENTS

| CN | 102593362 A | 7/2012 |
| JP | 2004165516 A | 6/2004 |

(Continued)

OTHER PUBLICATIONS

Wang, Taohong et al., "Improved performance of polymer solar cells by using inorganic, organic, and doped cathode buffer layers", Chin Phys. B, vol. 25, No. 3, (2016) 038402.

Yu, Junsheng et al., "Organic photovoltaic cells based on TPBi as a cathode buffer layer", Solar Energy Materials & Solar Cells, 95, (2011) p. 664-668.

Japanese Office Action dated Feb. 6, 2024 for corresponding Japanese Application No. 2020-034248, and English-language translation thereof.

(Continued)

*Primary Examiner* — Dylan C Kershner
(74) *Attorney, Agent, or Firm* — Harness, Dickey & Pierce, P.L.C.

(57) ABSTRACT

An imaging device includes a photoelectric conversion device including a sequential stack of an anode, a hole transport buffer layer, a photoelectric conversion layer, an electron transport buffer layer, and a cathode. The photoelectric conversion layer includes a p-type organic semiconductor and an n-type organic semiconductor. The electron transport buffer layer includes a compound represented by General Formula (1), and the p-type organic semiconductor includes a compound represented by General Formula (2):

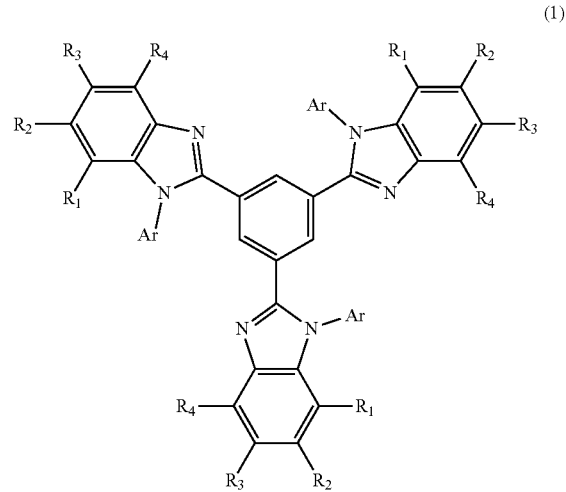

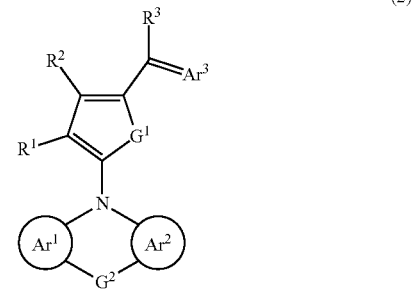

In General Formulas (1) and (2), Ar, $R_1$ to $R_4$, $Ar^3$, $R^1$ to $R^3$, $Ar^1$ and $Ar^2$, and $G^1$ and $G^2$ are as defined in the specification.

11 Claims, 3 Drawing Sheets

(56) References Cited

U.S. PATENT DOCUMENTS

| | | |
|---|---|---|
| 10,297,775 B2 | 5/2019 | Lassiter et al. |
| 10,905,920 B2 | 2/2021 | Parsons et al. |
| 2017/0154929 A1 | 6/2017 | Leem et al. |
| 2017/0331050 A1* | 11/2017 | Yagi ........................ H10K 30/81 |
| 2019/0123285 A1 | 4/2019 | Shin et al. |
| 2019/0131541 A1* | 5/2019 | Choi ..................... H10K 85/654 |
| 2019/0319071 A1 | 10/2019 | Hirose et al. |
| 2020/0221042 A1 | 7/2020 | Watanabe et al. |
| 2020/0308167 A1* | 10/2020 | Choi ..................... H10K 85/649 |
| 2020/0350500 A1* | 11/2020 | Choi ...................... H10K 30/30 |
| 2020/0376353 A1 | 12/2020 | Parsons et al. |

FOREIGN PATENT DOCUMENTS

| | | | |
|---|---|---|---|
| JP | 2005255573 A | * | 9/2005 |
| JP | 2008-227347 A | | 9/2008 |
| JP | 2009-182095 A | | 8/2009 |
| JP | 2011054746 A | | 3/2011 |
| JP | 2011077198 A | | 4/2011 |
| JP | 2011155276 A | | 8/2011 |
| JP | 2013-62503 A | | 4/2013 |
| JP | 201393353 A | | 5/2013 |
| JP | 2013084789 A | | 5/2013 |
| JP | 201515415 A | | 1/2015 |
| JP | 2015118977 A | | 6/2015 |
| JP | 2015523741 A | | 8/2015 |
| JP | 2017135703 A | | 8/2017 |
| JP | 201947294 A | | 3/2019 |
| KR | 20110088852 A | | 8/2011 |
| KR | 20130051582 A | | 5/2013 |
| KR | 20130062143 A | | 6/2013 |
| WO | 2014/092001 A1 | | 6/2014 |
| WO | WO-18016570 A1 | | 1/2018 |

OTHER PUBLICATIONS

Sebastian Valouch et al., "Solution processed small molecule organic interfacial layers for low dark current polymer photodiodes", Organic Electronics, vol. 13, No. 11, pp. 2727-2732, 2012.

* cited by examiner

[FIG. 1]
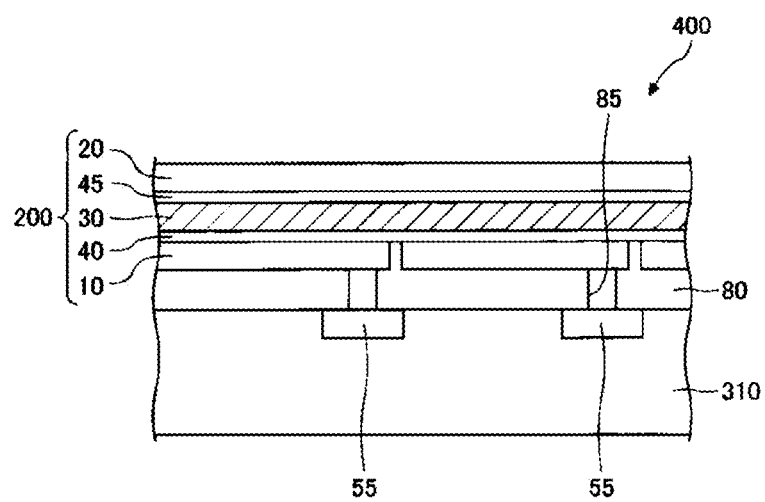
[FIG. 2]
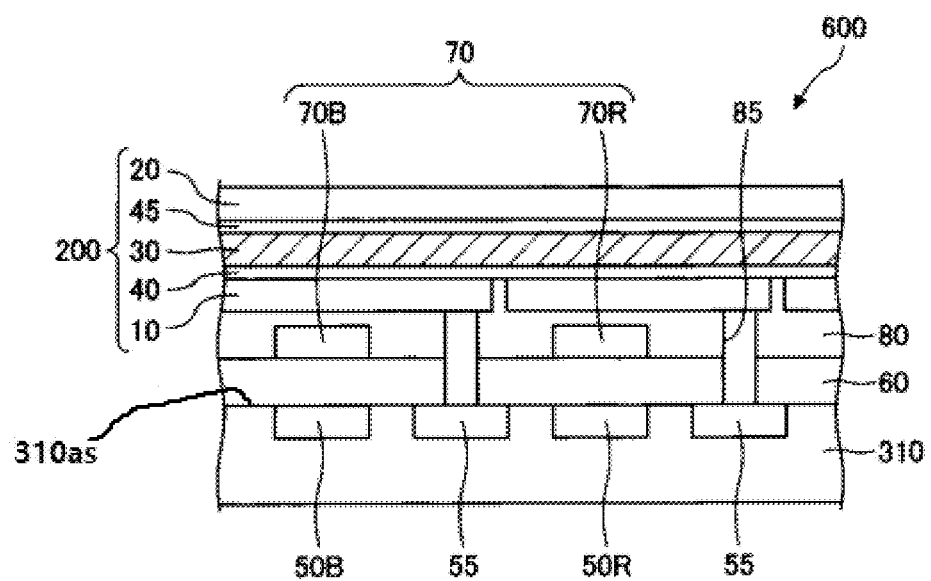

[FIG. 3]
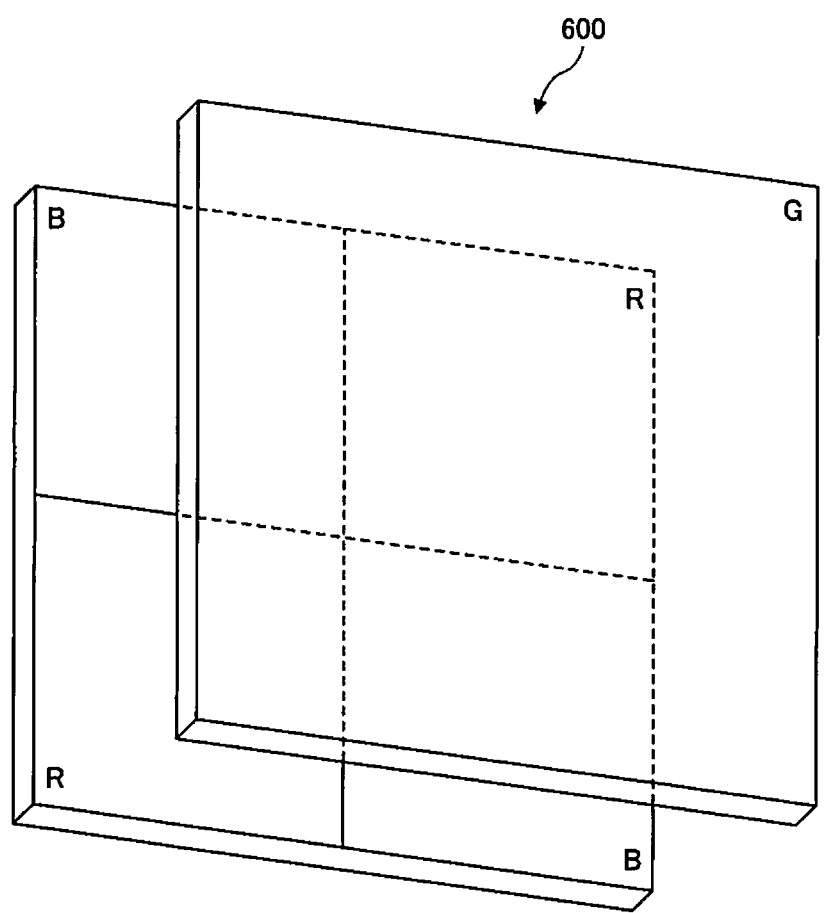

[FIG. 4]
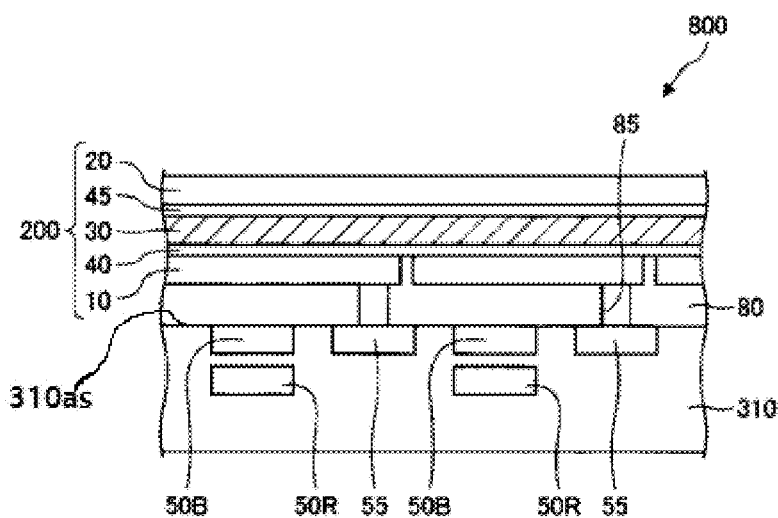
[FIG. 5]
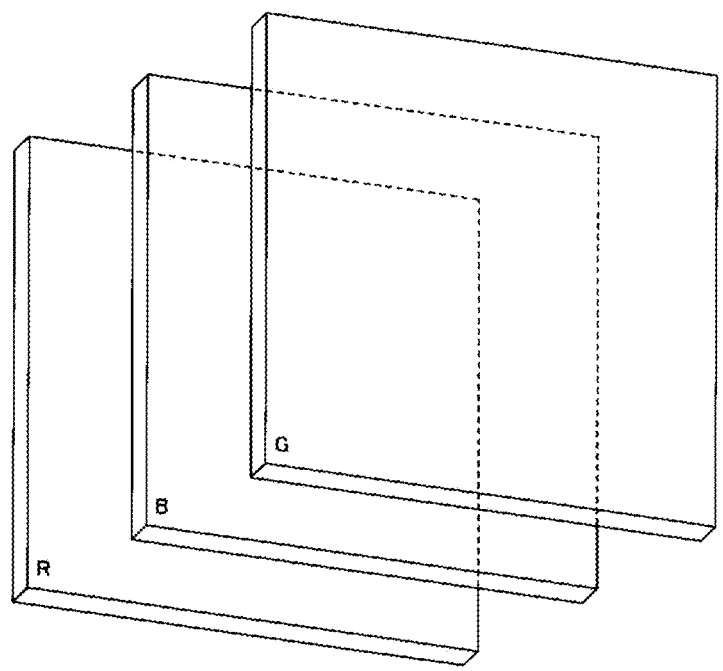

IMAGING DEVICES AND IMAGING APPARATUSES

CROSS-REFERENCE TO RELATED APPLICATIONS

This application claims priority to and the benefit of Japanese Patent Application No. 2020-034248 filed in the Japan Patent office on Feb. 28, 2020, and Korean Patent Application No. 10-2021-0025996 filed in the Korean Intellectual Property Office on Feb. 25, 2021, the entire contents of each of which are incorporated herein by reference.

BACKGROUND

1. Field

Imaging devices and imaging apparatuses are disclosed.

2. Description of the Related Art

In recent years, development of a photoelectric conversion device including a photoelectric conversion layer including an organic semiconductor, an imaging device including a photoelectric conversion device, and an imaging apparatus including an imaging device has been conducted.

A photoelectric conversion device may include a photoelectric conversion layer and a pair of electrodes (anode and cathode) that discharge charges (holes and electrons) generated in the photoelectric conversion layer to the outside of the photoelectric conversion device and disposed on both surfaces of the photoelectric conversion layer (For example, see Patent Document 1).

[Patent Document 1] US Patent Application Publication No. 2019/0123285

SUMMARY

Some example embodiments provide an imaging device that has a reduced number of residual electrons that cause afterimages when a motion picture is captured using an imaging apparatus that includes the imaging device. Here, residual electrons are electric charges observed as currents that continue to flow even after light is blocked. Herein, the terms "number" and "quantity" may be used interchangeably.

Some example embodiments provides an imaging device capable of reducing the number of residual electrons.

An imaging device according to some example embodiments includes a photoelectric conversion device including a sequential stack of an anode, a hole transport buffer layer, a photoelectric conversion layer, an electron transport buffer layer, and a cathode, wherein the photoelectric conversion layer includes a p-type organic semiconductor and an n-type organic semiconductor, the electron transport buffer layer includes a compound represented by General Formula (1), and the p-type organic semiconductor includes a compound represented by General Formula (2):

[General Formula (1)]

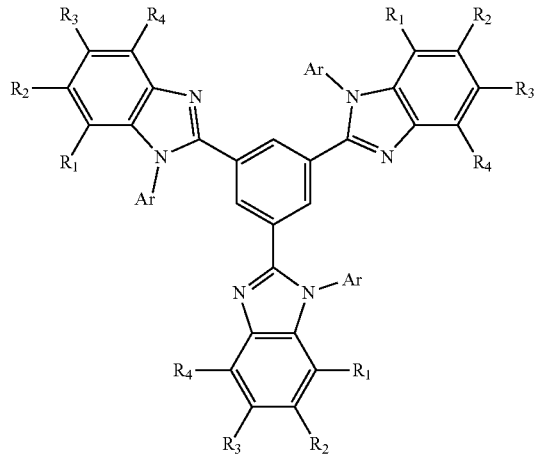

In General Formula (1),
Ar is a substituted or unsubstituted aryl group or a substituted or unsubstituted heteroaryl group, and
$R_1$ to $R_4$ are independently a hydrogen atom, a substituted or unsubstituted alkyl group, a substituted or unsubstituted aryl group, or a substituted or unsubstituted heteroaryl group;

[General Formula (2)]

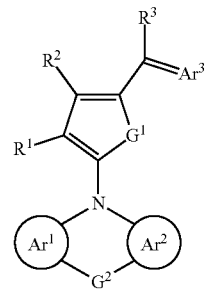

wherein, in General Formula (2),
$Ar^3$ is a substituted or unsubstituted hydrocarbon cyclic group including two carbonyl groups, or a substituted or unsubstituted heterocyclic group including two carbonyl groups,
$R^1$ to $R^3$ are independently a hydrogen atom, a deuterium atom, a substituted or unsubstituted alkyl group having 1 to 30 carbon atoms, an alkoxy group having 1 to 30 carbon atoms, or an aryl group having 6 to 30 carbon atoms,
$R^1$ and $R^2$ may be linked to each other to form a ring,
$Ar^1$ and $Ar^2$ are independently a substituted or unsubstituted arylene group having 6 to 30 carbon atoms, or a substituted or unsubstituted heteroarylene group having 3 to 30 carbon atoms, and
$G^1$ and $G^2$ are independently —$(CR_dR_e)_n$—, —Te—, —O—, —S—, —Se—, —$NR_f$—, —$SiR_gR_h$—, —$SiR_{gg}R_{hh}$—, —$GeR_iR_j$—, —$GeR_{ii}R_{jj}$—, —$C(R_m)$=$C(R_n)$—, —$C(R_{mm})$=$C(R_{nn})$—, or a single bond, wherein $R_d$, $R_e$, $R_f$, $R_g$, $R_h$, $R_i$, $R_j$, $R_m$, and $R_n$ are independently a hydrogen atom, a halogen atom, a substituted or unsubstituted alkyl group having 1 to 10 carbon atoms, or a substituted or unsubstituted aryl group having 6 to 10 carbon atoms, $R_{gg}$, $R_{hh}$, $R_{ii}$, $R_{jj}$, $R_{mm}$, and $R_{nn}$ are each independently a substituted or unsubstituted alkyl group having 1 to 10 carbon atoms, or a substituted or unsubstituted aryl group having 6 to 10 carbon atoms, at least one of $R_{gg}$ and $R_{hh}$, $R_{ii}$ and $R_{jj}$, or $R_{mm}$ and $R_{nn}$ is linked to each other to form a ring, and n in $-(CR_dR_e)_n-$ is 1 or 2.

The aryl group for Ar and $R_1$ to $R_4$ in General Formula (1) may be a monocyclic aryl group, a non-condensed polycyclic aryl group, or a condensed polycyclic aryl group.

The condensed polycyclic aryl group may be a naphthyl group, an anthryl group, a phenanthryl group, a fluorenyl group, an indenyl group, a pyrenyl group, an acetonaftenyl group, a bisphenyl fluorenyl group, or a 9-(9-fluorenyl) fluorenyl group.

The heteroaryl group for Ar and $R_1$ to $R_4$ in General Formula (1) may be a monocyclic heteroaryl group. The monocyclic heteroaryl group may be a pyrrolyl group, an imidazolyl group, a pyrazolyl group, an oxazolyl group, an isooxazolyl group, an oxadiazolyl group, a thiazolyl group, a furanyl group, a pyranyl group, a thienyl group, a pyridyl group, a pyrazyl group, a pyrimidinyl group, a pyridazinyl group, a triazinyl group, a quinolyl group, or an isoquinolyl group.

The heteroaryl group for Ar and $R_1$ to $R_4$ in General Formula (1) may be a polycyclic heteroaryl group. The polycyclic heteroaryl group may be a benzo(pyridyl)furanyl group, a benzofuranyl group, a benzothienyl group, an indolyl group, a carbazolyl group, a carbonyl group, a phenanthridinyl group, an acridinyl group, a perimidinyl group, a phenanthrolinyl group, a benzooxazolyl group, a benzothiazolyl group, a quinoxalyl group, a benzoimidazolyl group, a pyrazolyl group, a dibenzofuranyl group, or a dibenzothienyl group.

The compound represented by General Formula (1) may be one of the following compounds:

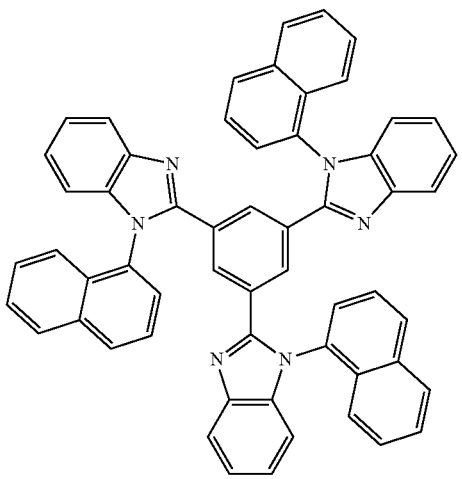

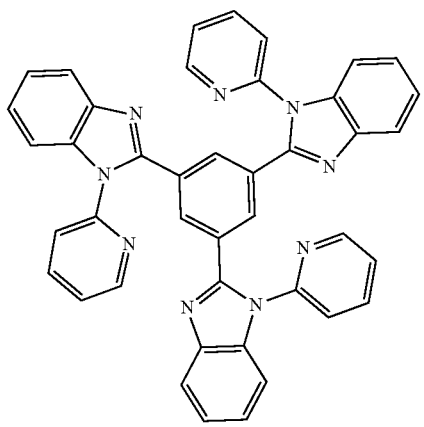

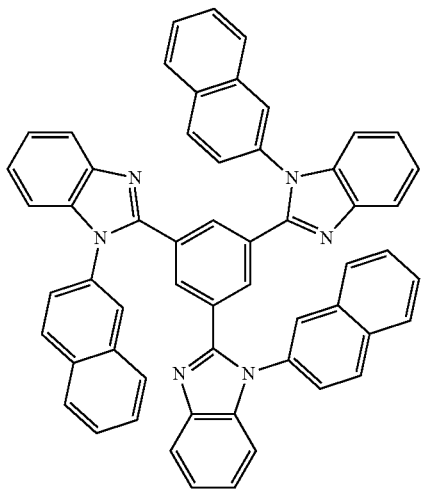

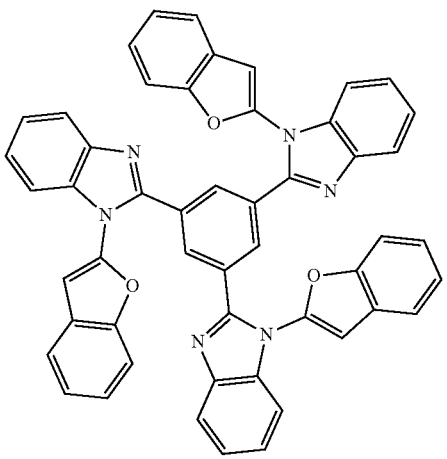

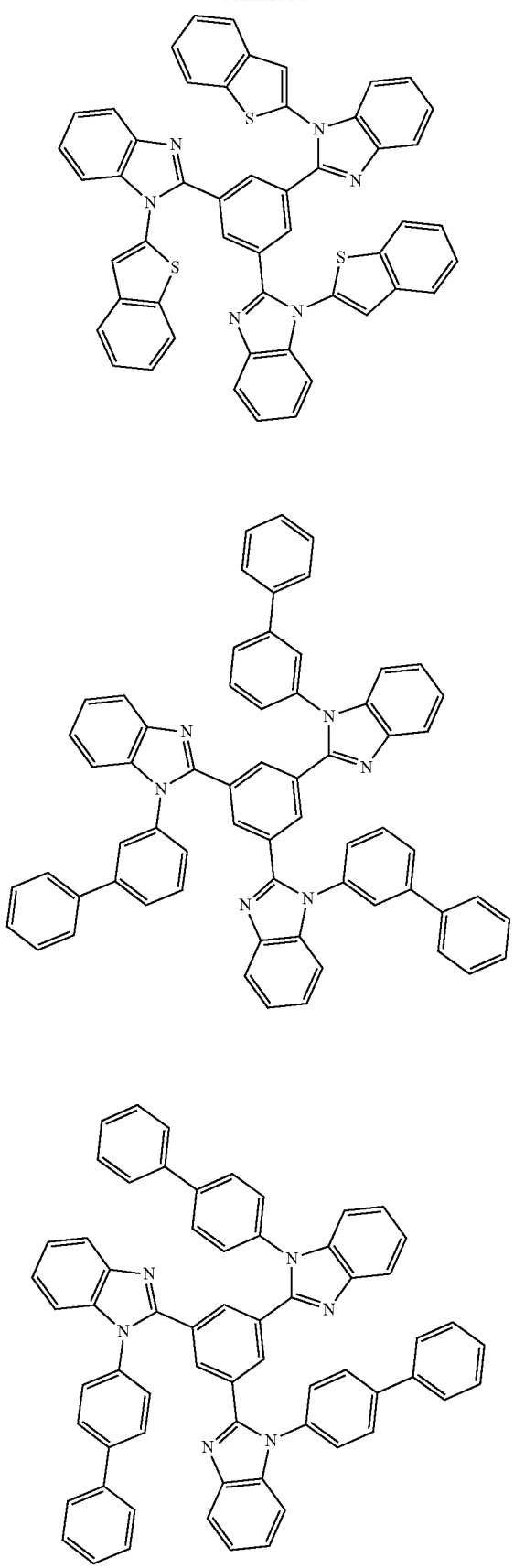
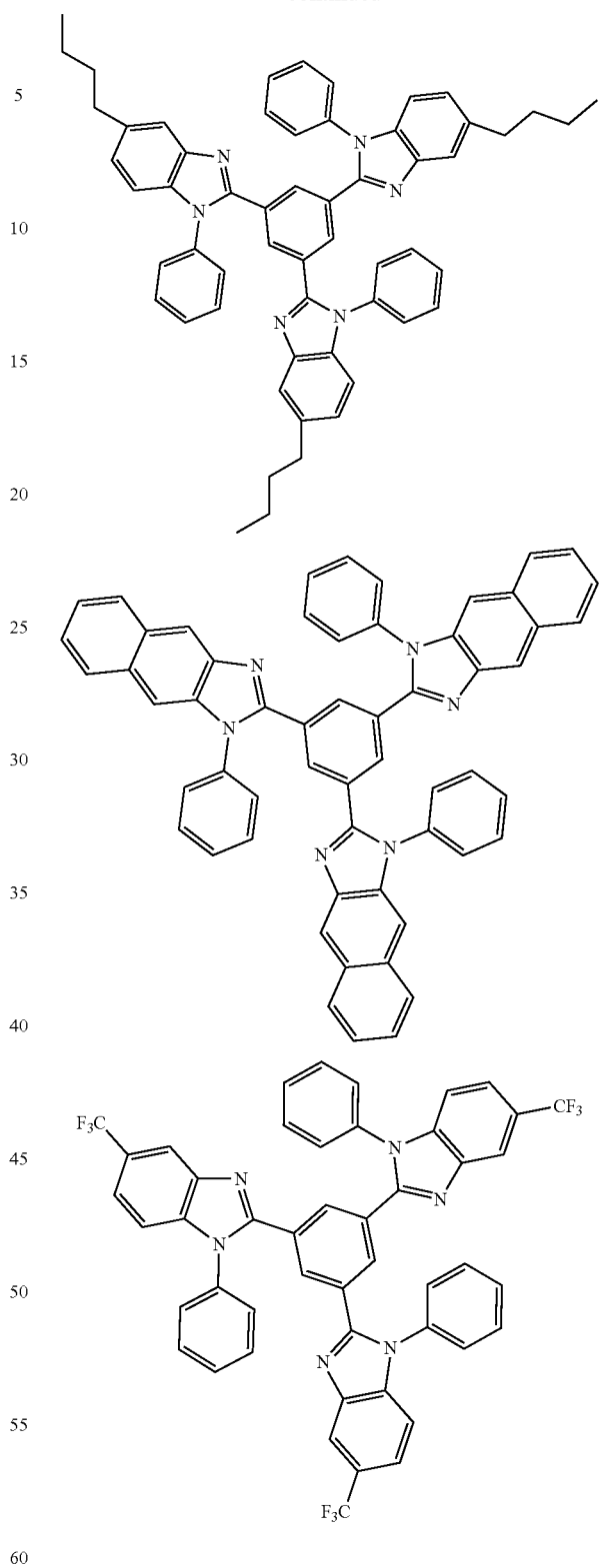
The compound represented by General Formula (1) may be 1,3,5-tris(1-phenyl-1H-benzimidazol-2-yl)benzene.
The n-type organic semiconductor may include fullerene, a fullerene derivative, or a combination thereof.
The compound represented by General Formula (2) may be one of the following compounds:

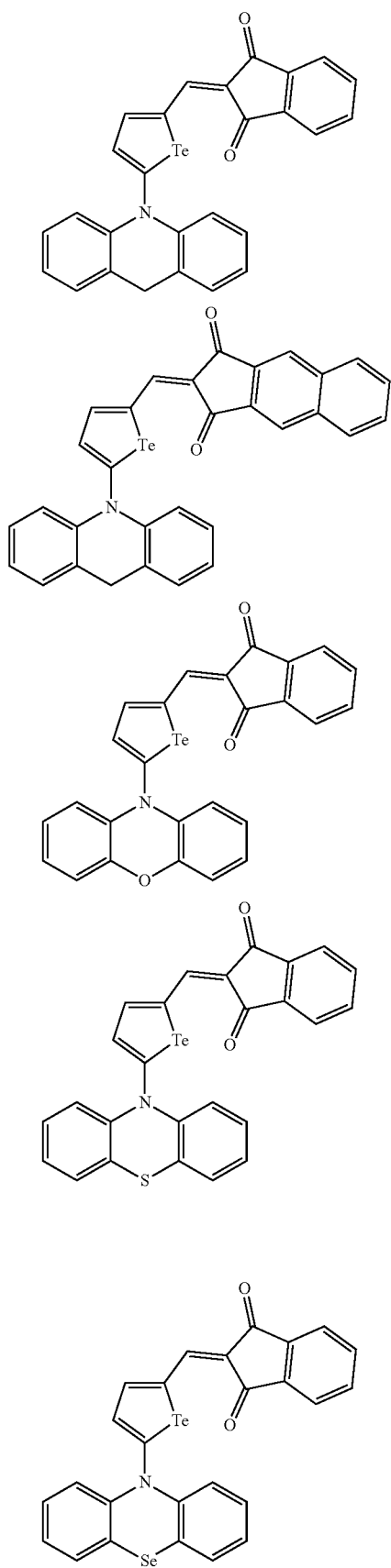
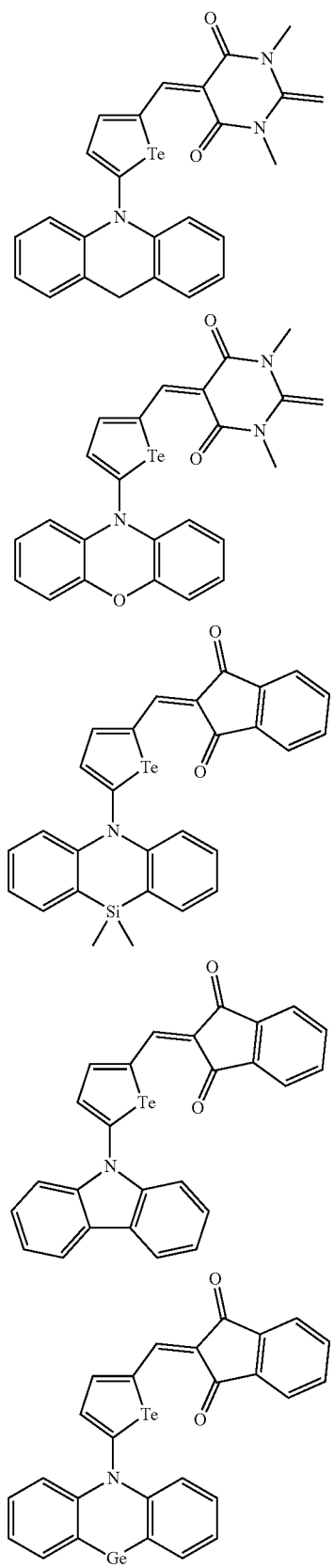

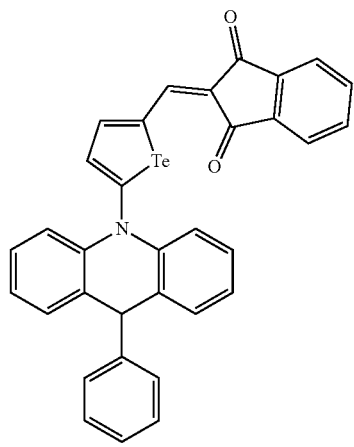
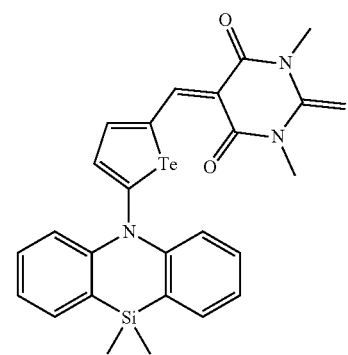
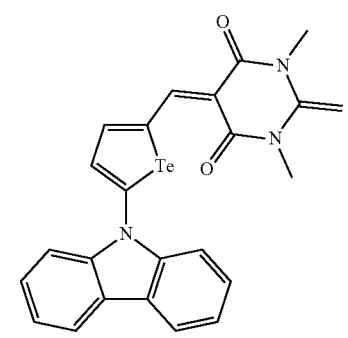
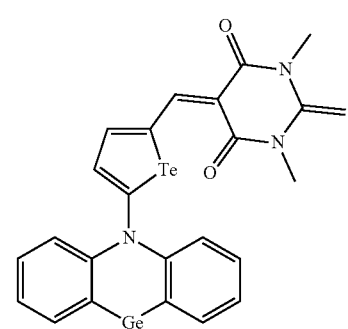
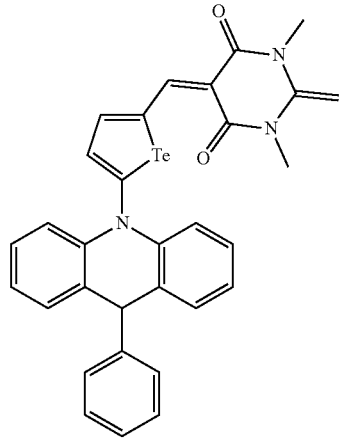
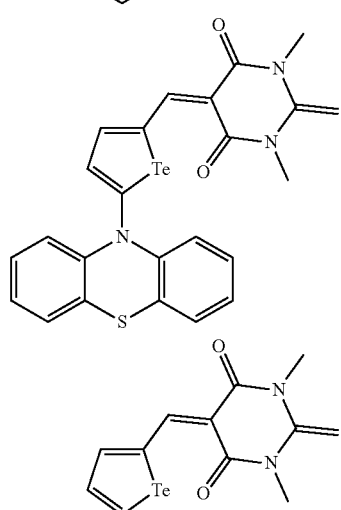
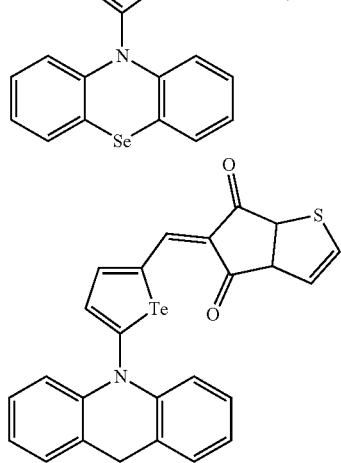
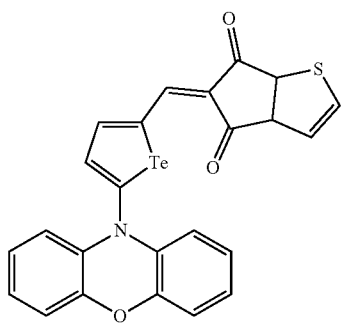

-continued
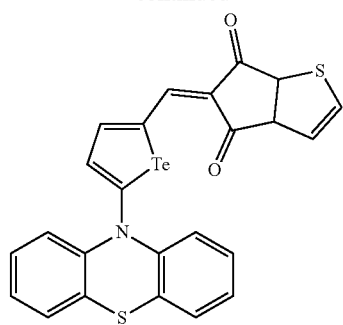
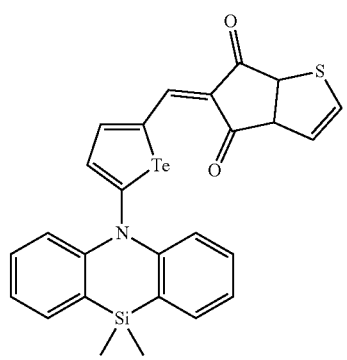
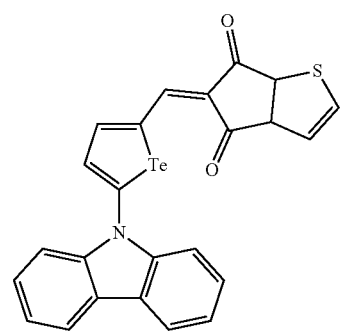
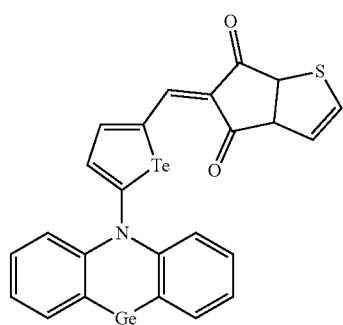
-continued
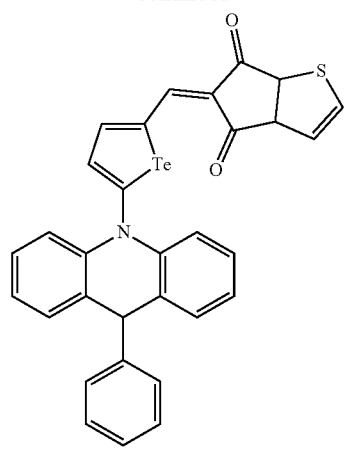
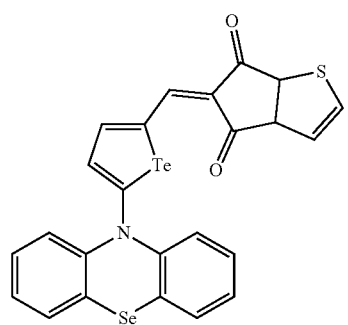
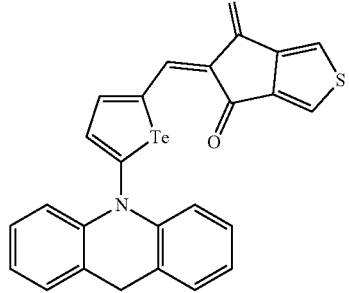
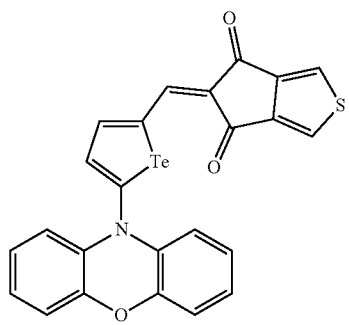

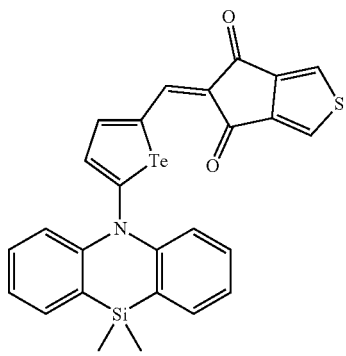

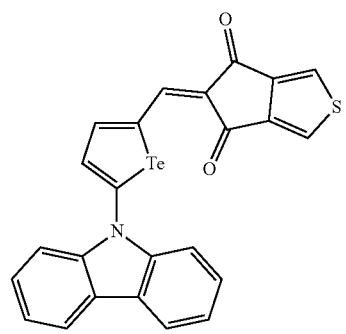

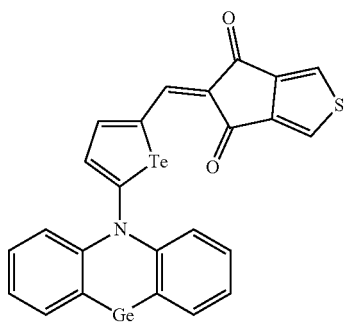

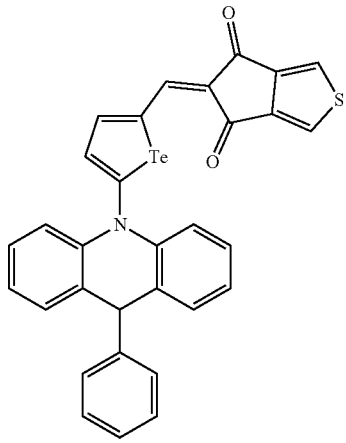

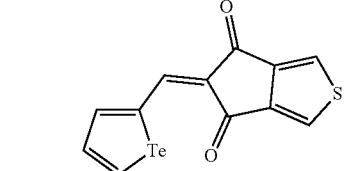

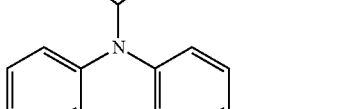

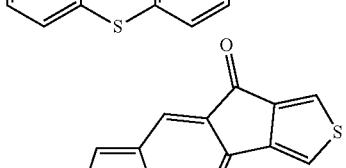

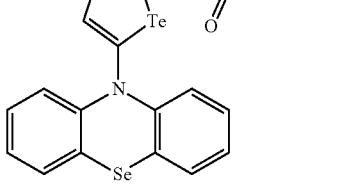

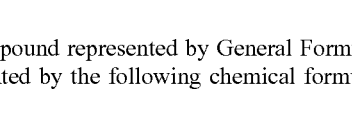

The compound represented by General Formula (2) may be represented by the following chemical formula:

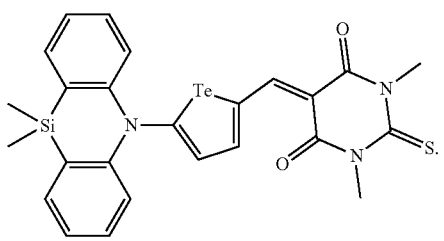

The n-type organic semiconductor includes sub-phthalocyanine, fullerene and a derivative thereof, thiophene and a derivative thereof, or a combination thereof.

A thickness of the electron transport buffer layer may be greater than or equal to about 1.5 nm and less than about 10 nm.

The imaging device may further include a substrate in which a first photosensing device configured to sense light in a blue wavelength region and a second photosensing device configured to sense light in a red wavelength region are integrated. The photoelectric conversion device may be on at least one of the first photosensing device or the second photosensing device such that the photoelectric conversion device overlaps at least one of the first photosensing device or the second photosensing device in a vertical direction extending perpendicular to an upper surface of the substrate, and the photoelectric conversion device may be a first photoelectric conversion device configured to selectively absorb light in a green wavelength region.

The first photosensing device and the second photosensing device may be stacked in a vertical direction extending perpendicular to the upper surface of the substrate.

The imaging device may further include a color filter layer between the substrate and the first photoelectric conversion device. The color filter layer may include a blue filter configured to selectively transmit light in a blue wavelength region, and a red filter configured to selectively transmit light in a red wavelength region. The blue filter may be on the first photosensing device such that the blue filter may overlap the first photosensing device in the vertical direction. The red filter may be on the second photosensing device such that the red filter may overlap the second photosensing device in the vertical direction.

The first photosensing device configured to sense light in the blue wavelength region may be a second photoelectric conversion device configured to selectively absorb light in the blue wavelength region, the second photosensing device configured to sense light in the red wavelength region may be a third photoelectric conversion device configured to selectively absorb light in the red wavelength region, and the first photoelectric conversion device, the second photoelectric conversion device, and the third photoelectric conversion device may be sequentially stacked and overlap each other in the vertical direction.

An imaging apparatus may include the imaging device.

According to some example embodiments, an imaging device capable of reducing the number of residual electrons may be provided.

BRIEF DESCRIPTION OF THE DRAWINGS

FIG. 1 is a cross-sectional view schematically showing a partial structure of a first example of an imaging device according to some example embodiments.

FIG. 2 is a cross-sectional view schematically showing a partial structure of a second example of the imaging device of some example embodiments.

FIG. 3 is a perspective view schematically showing a partial structure of a second example of an imaging device according to some example embodiments.

FIG. 4 is a cross-sectional view schematically showing a partial structure of a third example of an imaging device according to some example embodiments.

FIG. 5 is a perspective view schematically showing a partial structure of a fourth example of an imaging device according to some example embodiments.

DETAILED DESCRIPTION

Example embodiments of the present disclosure are described together with the drawings.

Hereinafter, in order to clearly express a plurality of layers and regions in the drawings, the thickness is enlarged and shown. In addition, in the drawings, unnecessary parts for description may be omitted in order to clearly describe forms for implementing the embodiments. In addition, the same reference numerals are assigned to the same or similar constituent elements throughout the specification.

In some example embodiments, when a certain part with a layer, film, region, plate, etc. is said to be "on" another part, the part may be "indirectly on" or "directly on the other part. When a certain part is said to be "indirectly on" another part, and an interposing structure and/or space may be present between the certain part and the other part such that the certain part and the other part are isolated from direct contact with each other. Conversely, when a certain part is said to be "directly on" another part, it means that there is no other part between the certain part and the other part such that the certain part is in direct contact with the other part.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

[Imaging Device]

FIG. 1 schematically shows a partial structure of a first example of an imaging device according to some example embodiments.

The imaging device 400 includes a photoelectric conversion device 200 and a substrate 310.

In the photoelectric conversion device 200, an anode 10, a hole transport buffer layer 40, a photoelectric conversion layer 30, an electron transport buffer layer 45, and a cathode 20 are sequentially stacked from a substrate 310. Restated, the photoelectric conversion device 200 may include a sequential stack of an anode 10, a hole transport buffer layer 40, a photoelectric conversion layer 30, an electron transport buffer layer 45, and a cathode 20 such that the aforementioned structures extend in parallel with each other. Herein, the cathode 20 may be a light-transmitting electrode. Accordingly, when light including light (green light) in a green wavelength region is incident from the cathode 20 side, the green light may be absorbed into the photoelectric conversion layer 30 and photoelectrically converted.

Materials constituting the light-transmitting electrode may include, for example, a conductive material such as indium tin oxide (ITO), indium zinc oxide (IZO), aluminum zinc oxide (AZO), fluorinated tin oxide (FTO), tin oxide (SnO$_2$), titanium oxide (TiO$_2$), and zinc oxide (ZnO$_2$).

The light-transmitting electrode may be formed of a single layer, or a plurality of layers that are stacked.

The anode 10 may be any of a light-transmitting electrode and a non-light-transmitting electrode.

Examples of the material constituting the non-light-transmitting electrode may include a metal such as aluminum, copper, gold, and silver, and a conductive material such as polysilicon to which conductivity is imparted by doping with impurities.

When forming the anode 10 and the cathode 20, various methods may be applied depending on the material to be used.

A method of forming an ITO electrode may include, for example, an electron beam method, a sputtering method, a resistance heating evaporation method, a chemical reaction method (for example, a sol-gel method), a method of applying a dispersion of indium tin oxide, and the like.

In some example embodiments, when forming the anode 10 and the cathode 20, treatments such as UV-ozone treatment and plasma treatment may be performed.

Here, the anode 10 is an electrode that samples holes among charges generated in the photoelectric conversion layer 30. In addition, the cathode 20 is an electrode that samples electrons among charges generated in the photoelectric conversion layer 30.

By applying a bias voltage between the anode 10 and the cathode 20, holes among charges generated in the photoelectric conversion layer 30 may be transferred to the anode 10 and electrons may be transferred to the cathode 20.

Here, the imaging device 400 converts and reads an electrical signal according to the amount of holes transferred to the anode 10. Accordingly, an optical signal may be converted into an electrical signal and extracted.

The electron transport buffer layer 45 reduces or prevents holes from being injected from the cathode 20 to the photoelectric conversion layer 30 and reduces or prevents holes generated in the photoelectric conversion layer 30 from moving to the cathode 20.

The electron transport buffer layer 45 includes a compound represented by General Formula (1).

[General Formula (1)]

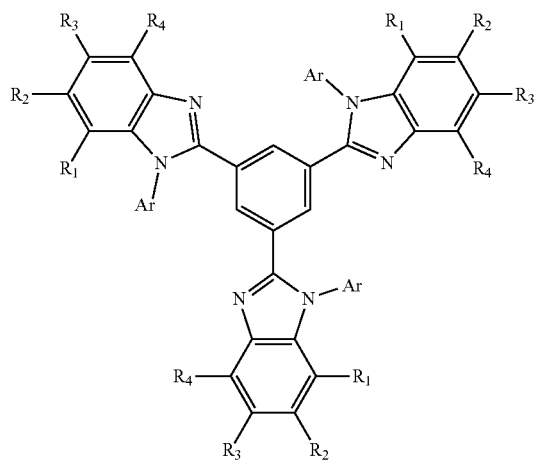

(1)

In General Formula (1),

Ar is a substituted or unsubstituted aryl group (e.g., phenyl group) or a substituted or unsubstituted heteroaryl group, and $R_1$ to $R_4$ are independently a hydrogen atom, a substituted or unsubstituted alkyl group, a substituted or unsubstituted aryl group, or a substituted or unsubstituted heteroaryl group.

As used herein, when specific definition is not otherwise provided, the "substituted" refers to replacement of a hydrogen of a compound by a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

Although not intending to be bound by a specific theory, since the compound represented by General Formula (1) has a planar structure and are stacked inside the electron transport buffer layer 45, whereby, electron mobility in an outward direction of the plane is increased. As a result, the number of residual electrons that cause afterimages may be reduced when a motion picture is captured.

In General Formula (1), the aryl group for Ar and $R_1$ to $R_4$ may be a monocyclic, a non-condensed polycyclic, or a condensed polycyclic aryl group (e.g., a monocyclic aryl group, non-condensed polycyclic aryl group, or condensed polycyclic aryl group).

The monocyclic aryl group may include, for example, a phenyl group.

The non-condensed polycyclic aryl group may include a biphenyl group, a terphenyl group, a quarterphenyl group, a kinked phenyl group, a sexyphenyl group, a fluoranthenyl group, a triphenylenyl group, and the like, but is not limited thereto.

The condensed polycyclic aryl group may include a naphthyl group, an anthryl group, a phenanthryl group, a fluorenyl group, an indenyl group, a pyrenyl group, an acetonaftenyl group, a bisphenyl fluorenyl group, a 9-(9-fluorenyl)fluorenyl group, and the like, but is not limited to thereto. For example, the condensed polycyclic aryl group may include a naphthyl group, an anthryl group, a phenanthryl group, a fluorenyl group, an indenyl group, a pyrenyl group, an acetonaftenyl group, a bisphenyl fluorenyl group, or a 9-(9-fluorenyl)fluorenyl group.

The number of carbon atoms forming the ring of the monocyclic, non-condensed polycyclic, or condensed polycyclic aryl group may be 6 to 50, for example, 6 to 40, for example, 6 to 30, for example, 6 to 20, but is not limited thereto.

The heteroaryl group for Ar and $R_1$ to $R_4$ in General Formula (1) may be a monocyclic, or a polycyclic heteroaryl group (e.g., a monocyclic heteroaryl group or a polycyclic heteroaryl group).

The monocyclic heteroaryl group may include, for example, a pyrrolyl group, an imidazolyl group, a pyrazolyl group, an oxazolyl group, an isooxazolyl group, an oxadiazolyl group, a thiazolyl group, a furanyl group, a pyranyl group, a thienyl group, a pyridyl group, a pyrazyl group, a pyrimidinyl group, a pyridazinyl group, a triazinyl group, a quinolyl group, an isoquinolyl group, and the like, but is not limited thereto. For example, the monocyclic heteroaryl group may be a pyrrolyl group, an imidazolyl group, a pyrazolyl group, an oxazolyl group, an isooxazolyl group, an oxadiazolyl group, a thiazolyl group, a furanyl group, a pyranyl group, a thienyl group, a pyridyl group, a pyrazyl group, a pyrimidinyl group, a pyridazinyl group, a triazinyl group, a quinolyl group, or an isoquinolyl group.

The polycyclic heteroaryl group may include, for example, a benzo(pyridyl)furanyl group, a benzofuranyl group, a benzothienyl group, an indolyl group, a carbazolyl group, a carbonyl group, a phenanthridinyl group, an acridinyl group, a perimidinyl group, a phenanthrolinyl group, a benzooxazolyl group, a benzothiazolyl group, a quinoxalyl group, a benzoimidazolyl group, a pyrazolyl group, a dibenzofuranyl group, a dibenzothienyl group, and the like, but is not limited thereto. For example, the polycyclic heteroaryl group may be a benzo(pyridyl)furanyl group, a benzofuranyl group, a benzothienyl group, an indolyl group, a carbazolyl group, a carbonyl group, a phenanthridinyl group, an acridinyl group, a perimidinyl group, a phenanthrolinyl group, a benzooxazolyl group, a benzothiazolyl group, a quinoxalyl group, a benzoimidazolyl group, a pyrazolyl group, a dibenzofuranyl group, or a dibenzothienyl group.

The number of carbon atoms forming the ring of the monocyclic or polycyclic heteroaryl group may be 5 to 50, for example, 5 to 40, for example, 5 to 30, for example, 5 to 20, but is not limited thereto.

The alkyl group for $R_1$ to $R_4$ may be a linear, branched, or cyclic alkyl group.

Examples of the linear alkyl group may include a methyl group, an ethyl group, a propyl group, a butyl group, an octyl group, a decyl group, and a pentadecyl group, but are not limited thereto.

Examples of the branched alkyl group may include a tert-butyl group, but are not limited thereto.

Examples of the cyclic alkyl group may include a cyclobutyl group, a cyclopentyl group, a cyclohexyl group, a cycloheptyl group, etc., but is not limited to thereto.

The number of carbon atoms in the linear or branched alkyl group may be 1 to 20, for example, 1 to 18, for example, 1 to 16, for example, 1 to 14, for example, 1 to 12, for example, 1 to 10, but is not limited thereto.

The number of carbon atoms of the cyclic alkyl group may be 3 to 20, for example, 3 to 18, for example, 3 to 16, for example, 3 to 14, for example, 3 to 12, but is not limited thereto.

In General Formula (1), a substituent for Ar, and $R_1$ to $R_4$, may be, for example, a cyano group, a silyl group, a mono(di or tri)alkyl silyl group having 1 to 10 carbon atoms, a linear, branched, or cyclic alkyl group having 1 to 10 carbon atoms, a linear or branched alkoxy group having 1 to 10 carbon atoms, an aryl group having 6 to 15 ring carbon atoms, an aryloxy group having 6 to 15 ring carbon atoms, an aryl carbonyl group having 6 to 15 ring carbon atoms, a heterocyclic group having 3 to 32 ring carbon atoms, a mono (or di) alkylamino group having 1 to 10 carbon atoms, a mono (or di) aryl amino group having 6 to 15 ring carbon atoms, and the like, but is not limited to thereto.

Examples of the compound represented by General Formula (1) may include the following compounds (e.g., the compound represented by General Formula (1) may be one of the following compounds):

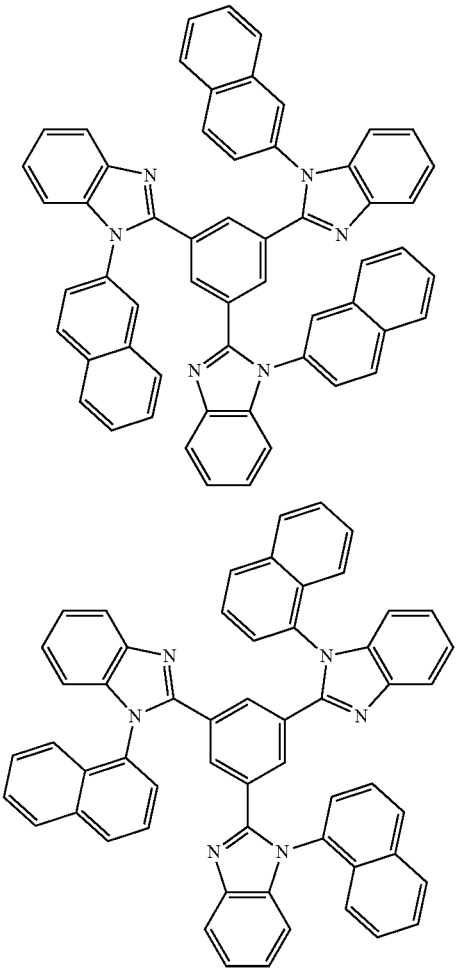

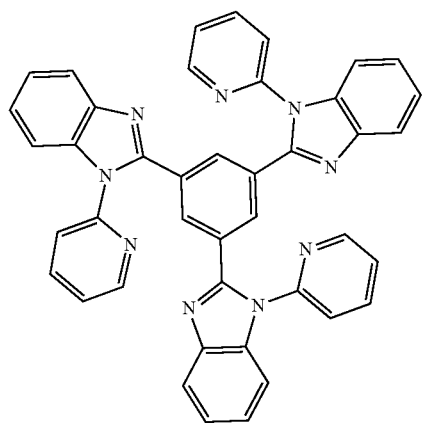
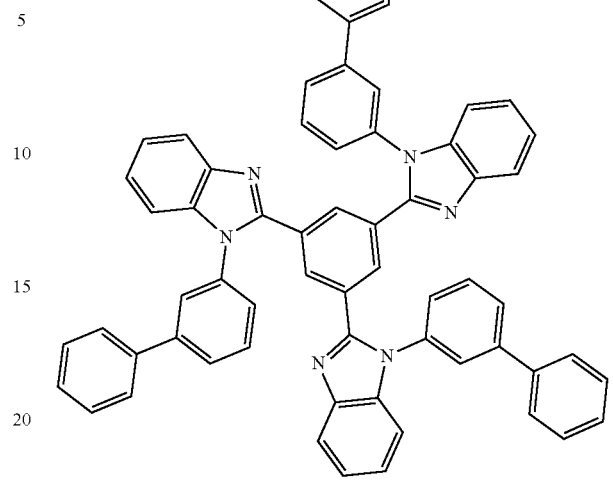
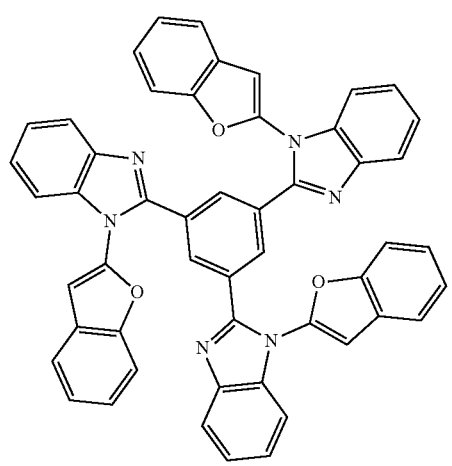
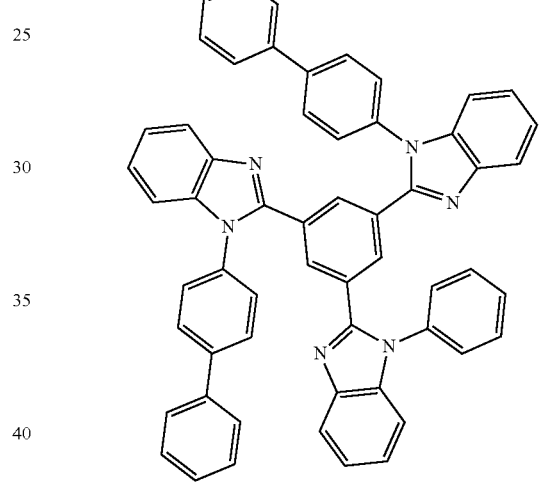
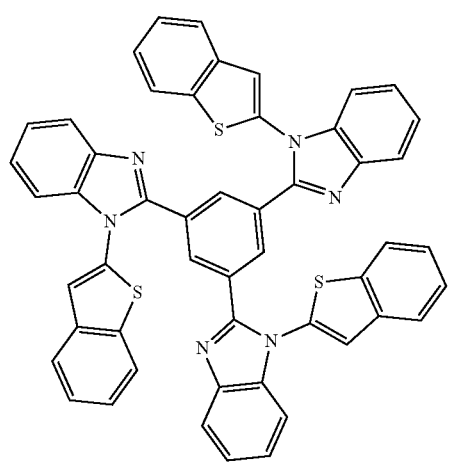
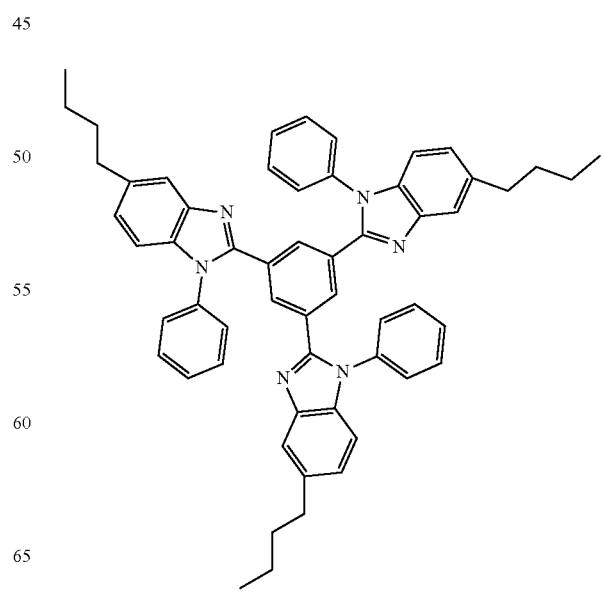

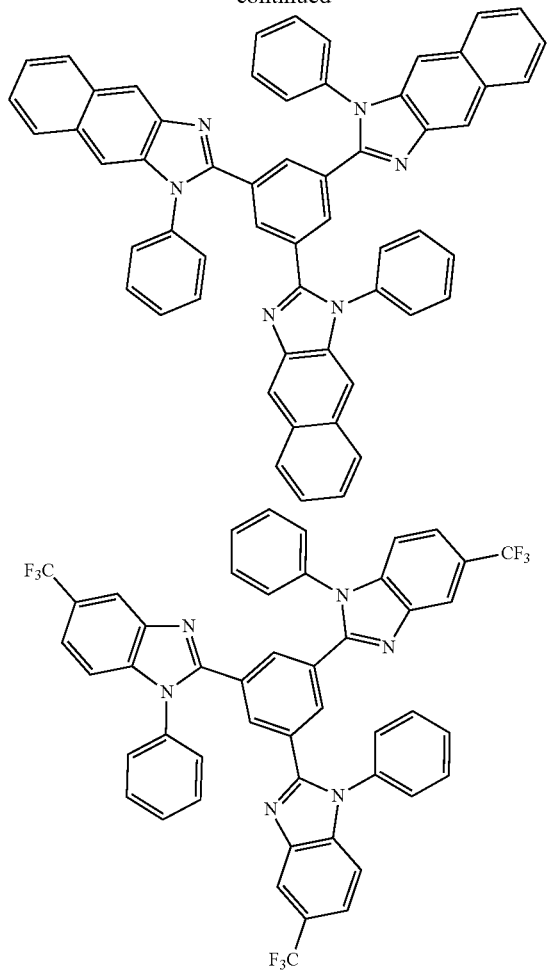

Among these compounds, for example, from the viewpoint of the number of remaining electrons in the imaging device 400, 1,3,5-tris(1-phenyl-1H-benzimidazol-2-yl)benzene (hereinafter referred to as "TPBi") may be included. Restated, in some example embodiments, the compound represented by General Formula (1) may be 1,3,5-tris(1-phenyl-1H-benzimidazol-2-yl)benzene.

Herein, TPBi is a compound represented by the following chemical formula:

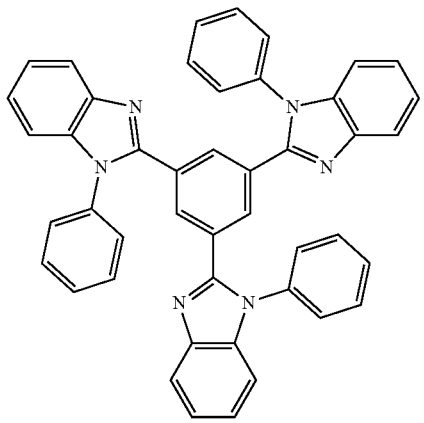 [SMILES: c1ccc(-n2c(-c3cc(-c4nc5ccccc5n4-c4ccccc4)cc(-c4nc5ccccc5n4-c4ccccc4)c3)nc3ccccc32)cc1]

The thickness of the electron transport buffer layer 45 may be greater than or equal to about 1.5 nm and less than about 10 nm.

When the thickness of the electron transport buffer layer 45 is greater than or equal to about 1.5 nm and less than about 10 nm, the photoelectric conversion efficiency of the imaging device 400 may be improved.

The photoelectric conversion layer 30 may include a p-type organic semiconductor and an n-type organic semiconductor.

The photoelectric conversion layer 30 may generate excitons when green light is incident thereon.

After the excitons are separated into holes and electrons, the holes are transferred to the anode 10 and the electrons are transferred to the cathode 20, and as a result, a current flows through the photoelectric conversion device 200.

The p-type organic semiconductor may include a compound represented by General Formula (2) (see Patent Document 1).

[General Formula (2)]

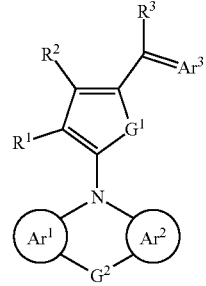

(2)

In General Formula (2), $Ar^3$ is a substituted or unsubstituted hydrocarbon cyclic group including two carbonyl groups, or a substituted or unsubstituted heterocyclic group including two carbonyl groups, $R^1$ to $R^3$ are independently a hydrogen atom, deuterium atom, a substituted or unsubstituted alkyl group having 1 to 30 carbon atoms, an alkoxy group having 1 to 30 carbon atoms, or an aryl group having 6 to 30 carbon atoms, $R^1$ and $R^2$ may be linked to each other to form a ring, $Ar^1$ and $Ar^2$ are independently a substituted or unsubstituted arylene group having 6 to 30 carbon atoms, or a substituted or unsubstituted heteroarylene group having 3 to 30 carbon atoms, and $G^1$ and $G^2$ are independently —$(CR_dR_e)_n$—, —Te—, —O—, —S—, —Se—, —$NR_f$—, —$SiR_gR_h$—, —$SiR_{gg}R_{hh}$—, —$GeR_iR_j$—, —$GeR_{ii}R_{jj}$—, —$C(R_m)=C(R_n)$—, —$C(R_{mm})=C(R_{nn})$—, or a single bond, wherein $R_d$, $R_e$, $R_f$, $R_g$, $R_h$, $R_i$, $R_j$, $R_m$, and $R_n$ are independently a hydrogen atom, a halogen atom, a substituted or unsubstituted alkyl group having 1 to 10 carbon atoms, or a substituted or unsubstituted aryl group having 6 to 10 carbon atoms, $R_{gg}$, $R_{hh}$, $R_{ii}$, $R_{jj}$, $R_{mm}$, and $R_{nn}$ are each independently a substituted or unsubstituted alkyl group having 1 to 10 carbon atoms, or a substituted or unsubstituted aryl group having 6 to 10 carbon atoms, at least one of $R_{gg}$ and $R_{hh}$, $R_{ii}$ and $R_{jj}$, or $R_{mm}$ and $R_{nn}$ is linked to each other to form a ring, and n in —$(CR_dR_e)_n$— is 1 or 2.

Examples of the compound represented by General Formula (2) may include the following compounds (e.g., the compound represented by General Formula (2) may be one of the following compounds):
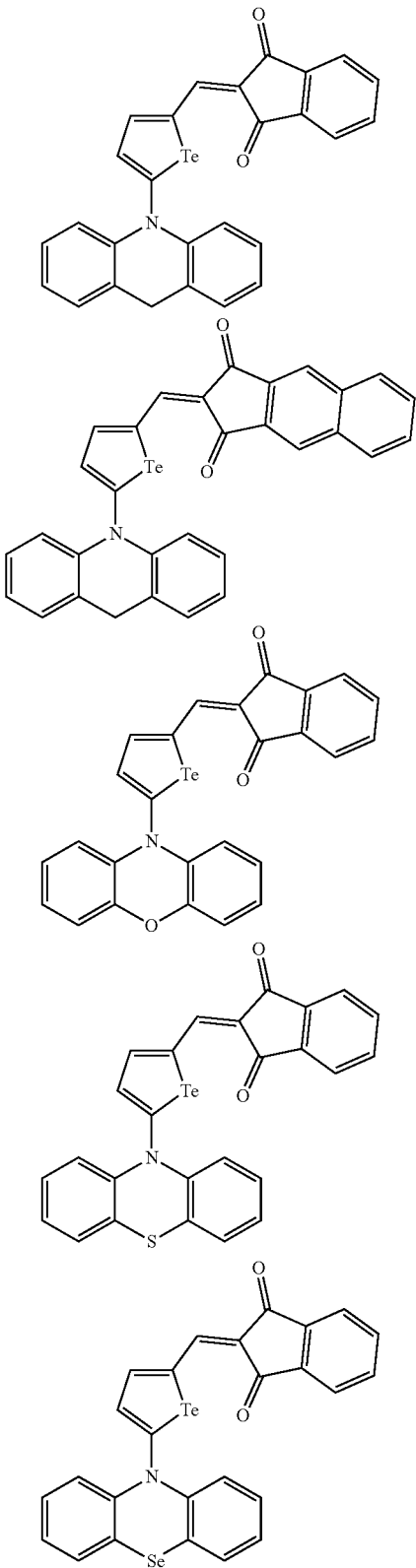
-continued
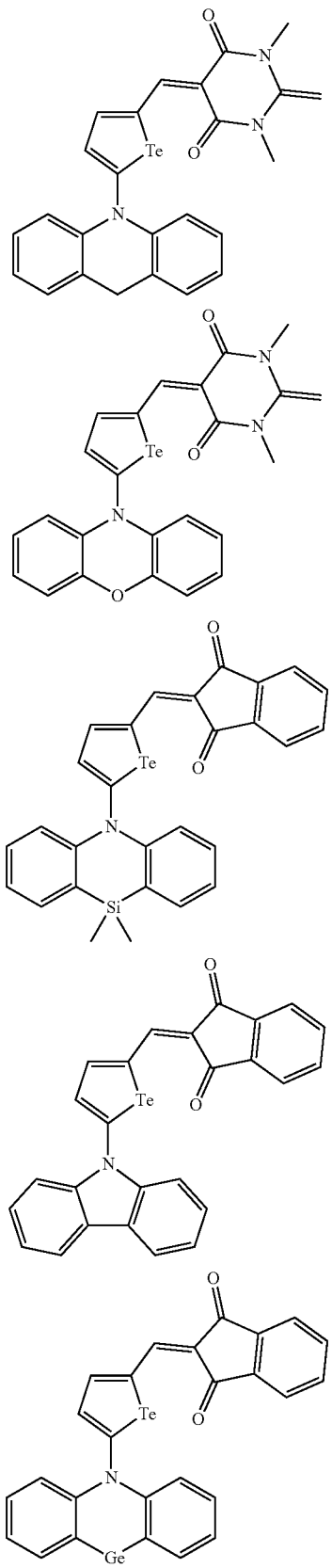

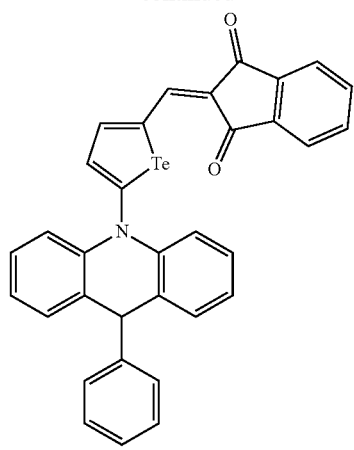
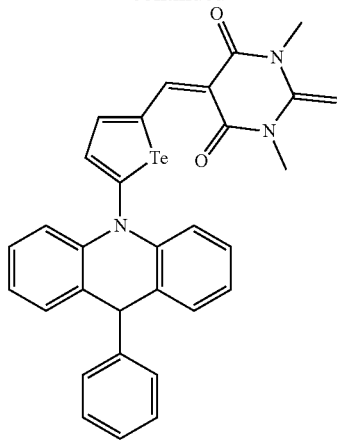

-continued
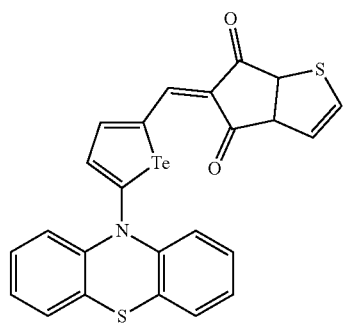
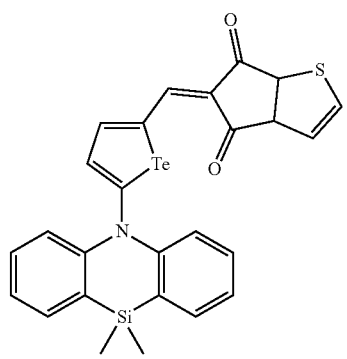
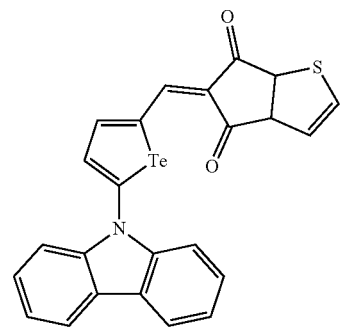
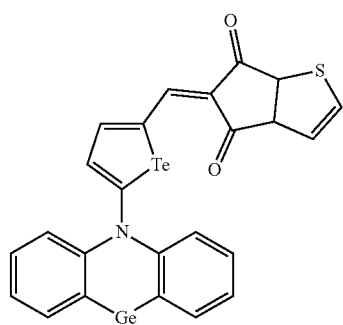
-continued
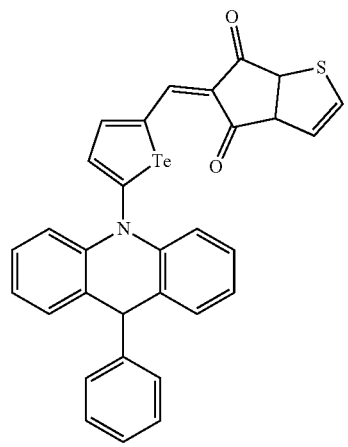
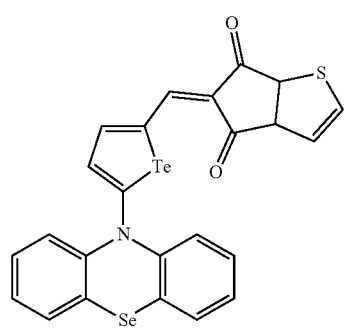
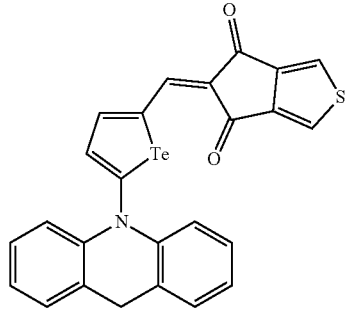
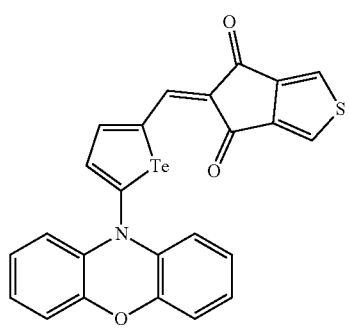

-continued

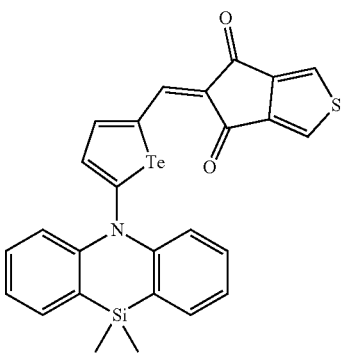

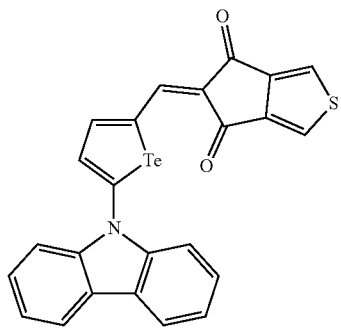

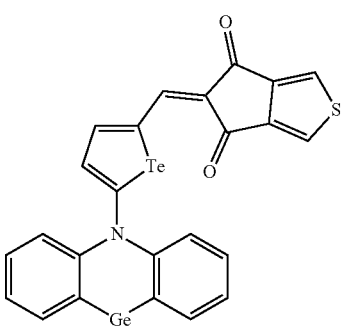

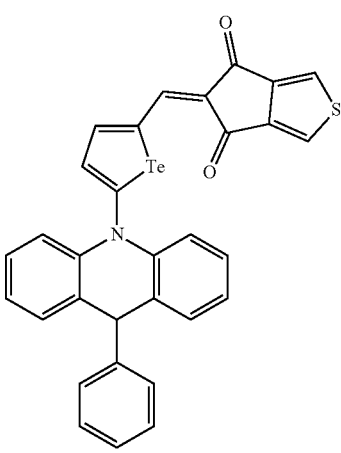

-continued

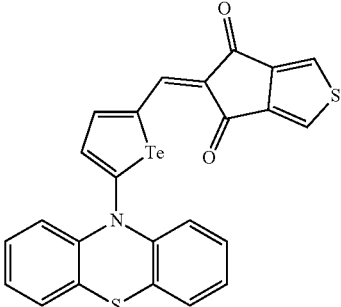

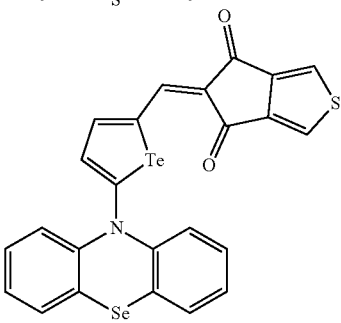

Among these, for example, from the viewpoint of photoelectric conversion efficiency of the imaging device 400, 5-((5-(10,10-dimethyldibenzo [b, e][1,4]azasilin-5(10H)-yl) tellurophen-2-yl)methylene)-1,3-dimethyl-2-thioxodihydropyrimidine-4,6(1H,5H)-dione (hereinafter referred to as "GDP1") may be included.

Herein, GDP1 is a compound represented by the following chemical formula, and thus the compound represented by General Formula (2) may be represented by the following chemical formula:

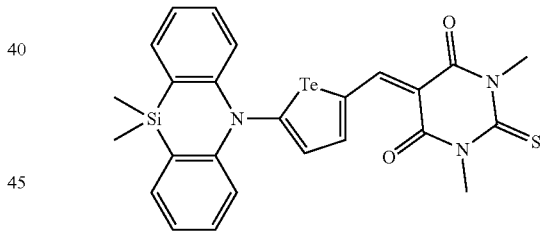

The n-type organic semiconductor is not particularly limited as long as it is possible to form a pn junction with a p-type organic semiconductor, and examples thereof may include subphthalocyanine, fullerene and/or a derivative thereof (e.g., fullerene, a fullerene derivative, or a combination thereof), thiophene and a derivative thereof, etc. These may be used alone or in some example embodiments, two or more types may be used in combination. Restated, the n-type organic semiconductor may include sub-phthalocyanine, fullerene and a derivative thereof, thiophene and a derivative thereof, or a combination thereof.

Among these, fullerene and/or a derivative of fullerene may be included in terms of photoelectric conversion efficiency of the photoelectric conversion device 200.

Examples of fullerenes may include C50 fullerene, C60 fullerene, C70 fullerene, C76 fullerene, C78 fullerene, C80 fullerene, C82 fullerene, C84 fullerene, C90 fullerene, C96 fullerene, C240 fullerene, C540 fullerene, and the like, but are not limited thereto.

The derivative of fullerene may include fullerene substituted by a substituent.

Examples of the substituent of the fullerene may include an alkyl group, an aryl group, and a heterocyclic group, but are not limited thereto.

The alkyl group may be a linear, branched, or cyclic alkyl group.

Examples of the linear alkyl group may include a methyl group, an ethyl group, a propyl group, a butyl group, an octyl group, a decyl group, and a pentadecyl group, but are not limited thereto.

Examples of the branched alkyl group may include a tert-butyl group, but are not limited thereto.

Examples of the cyclic alkyl group may include a cyclobutyl group, a cyclopentyl group, a cyclohexyl group, a cycloheptyl group, etc., but is not limited to thereto.

The number of carbon atoms in the linear or branched alkyl group may be 1 to 20, for example, 1 to 18, for example, 1 to 16, for example, 1 to 14, for example, 1 to 12, for example, 1 to 10, but is not limited thereto.

The number of carbon atoms of the cyclic alkyl group may be 3 to 20, for example, 3 to 18, for example, 3 to 16, for example, 3 to 14, for example, 3 to 12, but is not limited thereto.

The aryl group may be a monocyclic, non-condensed polycyclic, or condensed polycyclic aryl group.

The monocyclic aryl group may include, for example a phenyl group.

The non-condensed polycyclic aryl group may include a biphenyl group, a terphenyl group, a quarterphenyl group, a kinked phenyl group, a sexyphenyl group, a fluoranthenyl group, a triphenylenyl group, and the like, but is not limited thereto.

The condensed polycyclic aryl group may include a naphthyl group, an anthryl group, a phenanthryl group, a fluorenyl group, an indenyl group, a pyrenyl group, an acetonaftenyl group, a bisphenyl fluorenyl group, a 9-(9-fluorenyl)fluorenyl group, and the like, but is not limited to thereto.

The number of carbon atoms forming the ring of the monocyclic, non-condensed polycyclic, or condensed polycyclic aryl group may be 6 to 50, for example, 6 to 40, for example, 6 to 30, for example, 6 to 20, but is not limited thereto.

The heterocyclic group may be a monocyclic or a polycyclic heterocyclic group.

The monocyclic heterocyclic group may include, for example, a pyrrolyl group, an imidazolyl group, a pyrazolyl group, an oxazolyl group, an isooxazolyl group, an oxadiazolyl group, a thiazolyl group, a furanyl group, a pyranyl group, a thienyl group, a pyridyl group, a pyrazyl group, a pyrimidinyl group, a pyridazinyl group, a triadinyl group, a quinolyl group, an isoquinolyl group, and the like, but is not limited thereto.

The polycyclic heterocyclic group may include, for example, a benzo(pyridyl)furanyl group, a benzofuranyl group, a benzothienyl group, an indolyl group, a carbazolyl group, a carbonyl group, a phenanthridinyl group, an acridinyl group, a perimidinyl group, a phenanthrolinyl group, a benzooxazolyl group, a benzothiazolyl group, a quinoxalyl group, a benzoimidazolyl group, a pyrazolyl group, a dibenzofuranyl group, a dibenzothienyl group, and the like, and is not limited thereto.

The number of carbon atoms forming a ring of a monocyclic or a polycyclic heterocyclic group may be 5 to 50, for example, 5 to 40, for example, 5 to 30, for example, 5 to 20, but not limited thereto.

The photoelectric conversion layer 30 may be formed of a single layer, or a plurality of layers that are stacked.

The photoelectric conversion layer 30 formed as a single layer may be an intrinsic semiconductor layer.

The stacked structure of the photoelectric conversion layer 30 in which a plurality of layers are stacked may include, for example, a p-type semiconductor layer/intrinsic semiconductor layer, an intrinsic semiconductor layer/n-type semiconductor layer, a p-type semiconductor layer/intrinsic semiconductor layer/and an n-type semiconductor layer, a p-type semiconductor layer/n-type semiconductor layer, and the like, but is not limited thereto.

Herein, the intrinsic semiconductor layer includes a p-type organic semiconductor and an n-type organic semiconductor, the p-type semiconductor layer includes a p-type organic semiconductor, and the n-type semiconductor layer includes an n-type organic semiconductor.

A volume ratio of the p-type organic semiconductor to the n-type organic semiconductor in the intrinsic semiconductor layer may be about 0.01 to about 100, for example, about 0.01 to about 95, about 0.02 to about 95, about 0.05 to about 95, about 0.1 to about 95, or about 1 to about 95, but is not limited thereto. Accordingly, the photoelectric conversion efficiency of the photoelectric conversion device 200 may be improved.

A thickness of the photoelectric conversion layer 30 may be about 1 nm to about 800 nm, for example, about 5 nm to about 500 nm, for example, about 10 nm to about 500 nm, for example, about 20 nm to about 500 nm, for example, about 50 nm to about 500 nm, for example, about 100 nm to about 500 nm, but is not limited thereto.

Within the above ranges, the photoelectric conversion efficiency of the photoelectric conversion device 200 may be improved.

The photoelectric conversion layer 30 may be formed by a dry film forming method or, for example, a resistance heating evaporation method, but may be formed by, for example, a wet film forming method.

The dry film forming method may include, for example, a vacuum evaporation method etc.

Examples of the vacuum vapor deposition method may include an electron beam method, a sputtering method, and a resistance heating evaporation method, but are not limited thereto.

Examples of the wet film forming method may include a solution coating method and the like, and are not limited thereto.

The solution coating method may include, for example, a casting/casting method, a spin coating method, a dip coating method, a blade coating method, a wire bar coating method, a spray coating method, an inkjet printing method, a screen printing method, an offset method, an iron plate printing method, etc. but is not limited thereto.

Examples of the patterning method when patterning of the photoelectric conversion layer 30 is required may include a resist-etching method, a laser removal method, and the like, but is not limited thereto.

The hole transport buffer layer 40 reduces or prevents electrons from being injected from the anode 10 to the photoelectric conversion layer 30 and reduces or prevents electrons generated in the photoelectric conversion layer 30 from moving to the anode 10.

A material constituting the hole transport buffer layer 40 may include, for example, 4,4'-bis[N-naphthyl-N-phenylamino]biphenyl (α-NPD), N,N'-bis(3-methylphenyl)-(1,1'-biphenyl)-4,4'-diamine (TPD), 2-TNATA, 4,4',4''-tris(N-(3-methyl)N-phenylamino)triphenylamine (MTDATA), 4,4',4''-tris[2-naphthyl(phenyl)amino]triphenylamine (2-TNATA), 9,9'-(9,9,9',9'-tetramethyl-9H,9'H-[2,2'-bifluorene]-7,7'-diyl)bis(3,6-dimethyl-9H-carbazole) (hereinafter referred to as "EB1"), and the like. These may be used alone, or two or more may also be used together.

Among these, EB1 may be used from the viewpoint of reducing the dark current value of the imaging device 400 and heat resistance.

Herein, EB1 is a compound represented by the following chemical formula.

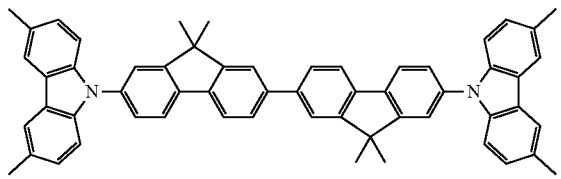

In some example embodiments, instead of the photoelectric conversion device 200, a photoelectric conversion device in which, from the substrate 310 side, the cathode 20, the electron transport buffer layer 45, the photoelectric conversion layer 30, the hole transport buffer layer 40, and the anode 10 are sequentially stacked may also be used. In this case, the anode 10 is a light-transmitting electrode, and the cathode 20 may be either a light-transmitting electrode or a non-light-transmitting electrode.

The substrate 310 is a silicon substrate, and a transmission transistor and a charge storage element 55 are integrated therein. Herein, the charge storage element 55 is electrically connected to the photoelectric conversion device 200, and information of the charge storage element 55 is transmitted by a transmission transistor. A metal wire and pad are installed on the substrate 310.

A material constituting the metal wire and the pad is not particularly limited as long as it is capable of reducing signal delay, and for example, a metal having low specific resistance such as aluminum, copper, silver, or an alloy thereof may be used.

An insulating layer 80 is formed between the photoelectric conversion device 200 and the substrate 310.

A material constituting the insulating layer 80 may include an inorganic insulating material such as silicon oxide and silicon nitride, and a relatively low dielectric constant material (low-k material) such as SiC, SiCOH, SiCO, and SiOF.

The insulating layer 80 is formed with a contact hole for exposing the pad and a through hole 85 for exposing the charge storage element 55.

Meanwhile, a bandpass filter that transmits only visible light may be installed on the photoelectric conversion device 200.

FIGS. 2 and 3 schematically show partial structures of second examples of the imaging devices of some example embodiments.

The imaging device 600 includes a substrate 310, a lower insulating layer 60, a color filter layer 70, an (upper) insulating layer 80, and a (first) photoelectric conversion device 200.

The substrate 310 is a silicon substrate, and a second photosensing device 50B configured to sense (e.g., absorb and/or photoelectrically convert) incident light in a blue wavelength region (blue light), a third photosensing device 50R configured to sense (e.g., absorb and/or photoelectrically convert) incident light in a red wavelength region (red light), a charge storage element 55, and a transmission transistor are integrated therein. Herein, the second photosensing device 50B and the third photosensing device 50R are silicon photodiodes. In some example embodiments, the second photosensing device 50B may be referred to as a first photo-sensing device and the third photosensing device 50R may be referred to as a second photo-sensing device.

The (first) photoelectric conversion device 200 is disposed on the second photosensing device 50B and the third photosensing device 50R to selectively absorb and/or photoelectrically convert incident green light. In addition, the charge storage element 55 is electrically connected to the (first) photoelectric conversion device 200.

Meanwhile, the (first) photoelectric conversion device 200 may be disposed on the second photosensing device 50B or the third photosensing device 50R. Accordingly, it will be understood that the (first) photoelectric conversion device 200 may be on at least one of the second photosensing device 50B or the third photosensing device 50R, such that the (first) photoelectric conversion device 200 may overlap at least one of the second photosensing device 50B or the third photosensing device 50R in a vertical direction extending perpendicular to an upper surface 310as of the substrate 310.

The color filter layer 70 may include a blue filter 70B that is formed on the second photosensing device 50B (e.g., to overlap the second photosensing device 50B in the vertical direction extending perpendicular to the upper surface 310as of the substrate 310) and selectively transmits (e.g., is configured to selectively transmit) blue light, and a red filter 70R that is formed on the third photosensing device 50R (e.g., to overlap the third photosensing device 50R in the vertical direction extending perpendicular to the upper surface 310as of the substrate 310) and selectively transmits (e.g., is configured to selectively transmit) red light.

Meanwhile, in FIG. 3, B and R schematically show regions in which the second photosensing device 50B and the third photosensing device 50R sense blue light and red light, respectively, and G schematically shows a region in which the (first) photoelectric conversion device 200 selectively absorbs green light.

The second photosensing device 50B and the third photosensing device 50R sense blue light and red light, respectively, and the sensed information is transmitted by a transmission transistor. Further, information on the charge storage element 55 is transmitted by a transmission transistor.

Although metal wire and pad are provided on the substrate 310, the metal wire and pad may be provided under the second photosensing device 50B, the third photosensing device 50R, and the charge storage element 55.

A lower insulating layer 60 is formed on the substrate 310.

The material constituting the lower insulating layer 60 may be the same material as the material constituting the insulating layer 80.

A color filter layer 70 is formed on the lower insulating layer 60 and is between the first photoelectric conversion device 200 and the substrate 310 (e.g., in the vertical direction).

On the color filter layer 70, a (upper) insulating layer 80 for flattening by removing a step difference due to the color filter layer 70 is formed.

In the (upper) insulating layer 80 and the lower insulating layer 60, a contact hole for exposing the pad and a through hole 85 for exposing the charge storage element 55 are formed.

The (first) photoelectric conversion device 200 is formed on the (upper) insulating layer 80.

In the (first) photoelectric conversion device 200, from the substrate 310 side, as described above, the anode 10, the hole transport buffer layer 40, the photoelectric conversion layer 30, and the electron transport buffer layer 45 and the cathode 20 are sequentially stacked. Herein, the anode 10 and the cathode 20 are light-transmitting electrodes capable of transmitting visible light. For this reason, when light including visible light is incident from the cathode 20 side, green light is absorbed by the photoelectric conversion layer 30 and photoelectric conversion is performed. Meanwhile, the light not absorbed by the photoelectric conversion layer 30 passes through the hole transport buffer layer 40, the anode 10, and the blue filter 70B (or red filter 70R), and then is sensed by the second photosensing device 50B (or the third photosensing device 50R).

Meanwhile, a bandpass filter that transmits only visible light may be provided on the (first) photoelectric conversion device 200.

FIG. 4 shows a third example of the imaging device of some example embodiments.

The imaging device 800, like the imaging device 600, includes a substrate 310, an insulating layer 80, and a (first) photoelectric conversion device 200, and at least a second photosensing device. A second photosensing device 50B, a third photosensing device 50R, a charge storage element 55, and a transmission transistor are integrated in the substrate 310.

In some example embodiments, in the imaging device 800, unlike the imaging device 600, the second photosensing device 50B and the third photosensing device 50R are stacked in a vertical direction extending perpendicular with respect to the upper surface 310as of the substrate 310, so that the color filter layer 70 is omitted.

The second photosensing device 50B and the third photosensing device 50R sense blue light and red light, respectively, according to a stacking depth.

Since the second photosensing device 50B, the third photosensing device 50R, and the (first) photoelectric conversion device 200 are stacked (e.g., in the vertical direction), the imaging device 800 may be downsized.

Meanwhile, instead of integrating the second photosensing device 50B and the third photosensing device 50R in the substrate 310, a second photoelectric conversion device configured to selectively absorb blue light, and a third photoelectric conversion device configured to selectively absorb red light may be disposed on the substrate 310, and the (first) photoelectric conversion device may be stacked (see FIG. 5). Accordingly, as shown in FIG. 5, the imaging device may include a second photosensing device that is a second photoelectric conversion device configured to selectively absorb light in the blue wavelength region, a third photosensing device that is a third photoelectric conversion device configured to selectively absorb light in the red wavelength region, and the first photoelectric conversion device 200, the second photoelectric conversion device, and the third photoelectric conversion device may be sequentially stacked and overlap each other in the vertical direction that extends perpendicular to a substrate on which the first to third photoelectric conversion devices are stacked.

Accordingly, sensitivity of the imaging device may be improved and cross talk may be reduced.

Here, G, B, and R schematically show a region in which the (first) photoelectric conversion device 200 selectively absorbs green light, a region in which the second photoelectric conversion device selectively absorbs blue light, and a region in which the third photoelectric conversion device selectively absorbs red light.

In the second photoelectric conversion device, a photoelectric conversion layer including a known organic semiconductor that selectively absorbs blue light is formed between the anode and the cathode, and a hole transport buffer layer and/or an electron transport buffer layer are further formed if necessary.

In the third photoelectric conversion device, a photoelectric conversion layer including a known organic semiconductor that selectively absorbs red light is formed between the anode and the cathode, and a hole transport buffer layer and/or an electron transport buffer layer are further formed if necessary.

In some example embodiments, the order of stacking the (first) photoelectric conversion device 200, the second photoelectric conversion device, and the third photoelectric conversion device is not particularly limited.

The imaging device of some example embodiments may be applied to various imaging apparatus such as mobile telephones, digital cameras, and digital video recorder.

EXAMPLES

Hereinafter, examples of the present disclosure are described. However, the technical scope of the present disclosure is not limited to the following examples.

Example 1

EB1 is formed into a film having a thickness of 5 nm by a resistance heating evaporation method directly on a glass substrate with an ITO film having a thickness of 100 nm to form a hole transport buffer layer. Then, by a resistance heating evaporation method, a film is formed using GDP1 as a p-type organic semiconductor, fullerene C60 as an n-type organic semiconductor, at a p/n ratio of 1, with a film thickness of 100 nm to form a photoelectric conversion layer. Then, TPBi is formed into a film with a film thickness of 1.5 nm by a resistance heating evaporation method to form a hole transport buffer layer. Further, an ITO film was formed with a film thickness of 10 nm by a high frequency magnetron sputtering method to obtain a photoelectric conversion device.

In some example embodiments, a degree of vacuum in the vacuum process is set to $4 \times 10^{-4}$ Pa or less.

Examples 2 to 4

Photoelectric conversion devices are obtained in the same manner as in Example 1, except that TPBi is formed into a film such that the hole transport buffer layer has a thickness of 2.5 nm, 5 nm, and 10 nm, respectively.

Comparative Examples 1 to 3

Photoelectric conversion devices are obtained in the same manner as in Examples 2 to 4, respectively, except that dipyrazino [2,3-F:2',3'-H]quinoxaline-2,3,6,7,10,11-hexacarbonitrile (hereinafter referred to as HAT-CN) is used instead of TPBi.

Herein, HAT-CN is a compound represented by the following chemical formula.

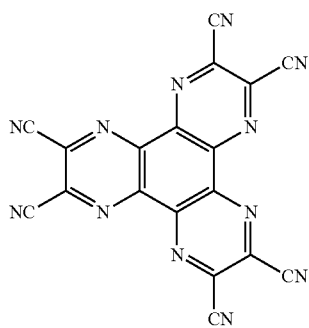 [SMILES: N#Cc1nc2c3nc(C#N)c(C#N)nc3c3nc(C#N)c(C#N)nc3c2nc1C#N]

Comparative Examples 4 to 6

Photoelectric conversion devices are obtained in the same manner as in Examples 2 to 4, respectively, except that 1,3-bis[5-(4-tert-butylphenyl)-2-[1,3,4]oxadiazolyl]benzene (hereinafter referred to as OXD-7) is used instead of TPBi.

Herein, OXD-7 is a compound represented by the following chemical formula.

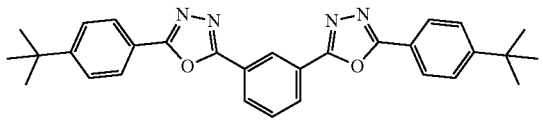 [SMILES: CC(C)(C)c1ccc(-c2nnc(-c3cccc(-c4nnc(-c5ccc(C(C)(C)C)cc5)o4)c3)o2)cc1]

Then, the number of residual electrons and IPCE of the photoelectric conversion device are evaluated.

[The Number of Residual Electrons of Photoelectric Conversion Device, IPCE]

The photoelectric conversion devices are conveyed to a glove box in which the moisture and oxygen contents are kept at 1 ppm or less, respectively, without exposure to the atmosphere. Thereafter, the photoelectric conversion devices are sealed with a glass sealing can to which a moisture absorbent is attached using an ultraviolet curable resin, and then heat-treated at 180° C. for 3 hours.

Using the IPCE measurement system (manufactured by Mac Science), the numbers of residual electrons [number of electrons/33 ms] are measured after dark-charging by irradiation with visible light having an illuminance of 5000 lx with a negative bias applied to the side of the glass substrates with the ITO films of the photoelectric conversion devices at 3 V, and the external quantum efficiency (IPCE) at the maximum value of the photoelectric conversion efficiency of light of a wavelength of 500 nm to 720 nm is measured.

Then, the afterimage characteristics of the imaging apparatus are evaluated.

[Afterimage Characteristics]

After applying the photoelectric conversion device to the imaging apparatus, a motion picture is photographed, and the presence or absence of an afterimage was evaluated with naked eye.

In some example embodiments, the criteria for determining afterimage characteristics are as follows.
- ○: When an object of 30,000 lux is photographed, the afterimage is not visible with naked eye
- △: When an object of 10,000 lux is photographed, the afterimage is not visible with naked eye, but when an object of 30,000 lux is photographed, the afterimage is confirmed with naked eye
- ×: When an object of 10,000 lux is photographed, an afterimage is confirmed with naked eye Table 1 shows evaluation results of the number of residual electrons of the photoelectric conversion device, IPCE, and afterimage characteristics of the imaging apparatus.

TABLE 1

| | Electron transport buffer layer | | Photoelectric conversion device | | Imaging apparatus Afterimage characteristics |
|---|---|---|---|---|---|
| | Material | Film thickness (nm) | The number of residual electrons [/33 ms] | IPCE [%] | |
| Example 1 | TPBi | 1.5 | 123 | 66 | ○ |
| Example 2 | TPBi | 2.5 | 119 | 66 | ○ |
| Example 3 | TPBi | 5 | 114 | 67 | ○ |
| Example 4 | TPBi | 10 | 62 | 55 | ○ |
| Comparative Example 1 | HAT-CN | 2.5 | 839 | 66 | × |
| Comparative Example 2 | HAT-CN | 5 | 698 | 67 | × |
| Comparative Example 3 | HAT-CN | 10 | 471 | 43 | × |
| Comparative Example 4 | OXD-7 | 2.5 | 432 | 67 | △ |
| Comparative Example 5 | OXD-7 | 5 | 242 | 51 | △ |
| Comparative Example 6 | OXD-7 | 10 | 235 | 31 | △ |

From Table 1, the photoelectric conversion devices of Examples 1 to 4 have a small number of residual electrons, and that the imaging apparatus including the photoelectric conversion devices of Examples 1 to 4 exhibit improved afterimage characteristics. Further, the photoelectric conversion devices of Examples 1 to 4 exhibit high IPCE.

In contrast, since the electron transport buffer layer does not include the compound represented by General Formula (1), the photoelectric conversion devices of Comparative Examples 1 to 6 have a large number of residual electrons and the imaging apparatus including the photoelectric conversion devices of Comparative Examples 1 to 6 exhibit deteriorated afterimage characteristics.

While this disclosure has been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

DESCRIPTION OF SYMBOLS

- 10: anode
- 20: cathode
- 30: photoelectric conversion layer
- 40: hole transport buffer layer
- 45: electron transport buffer layer
- 50B: second photosensing device
- 50R: third photosensing device
- 70: color filter layer
- 70B: blue filter
- 70R: red filter
- 200: first photoelectric conversion device
- 400, 600, 800: imaging device

What is claimed is:
1. An imaging device, comprising:
a photoelectric conversion device including a sequential stack of an anode, a hole transport buffer layer, a photoelectric conversion layer, an electron transport buffer layer, and a cathode,
wherein the photoelectric conversion layer includes a p-type organic semiconductor and an n-type organic semiconductor,
wherein the electron transport buffer layer includes a compound represented by General Formula (1),
wherein the p-type organic semiconductor includes a compound represented by General Formula (2):

[General Formula (1)]

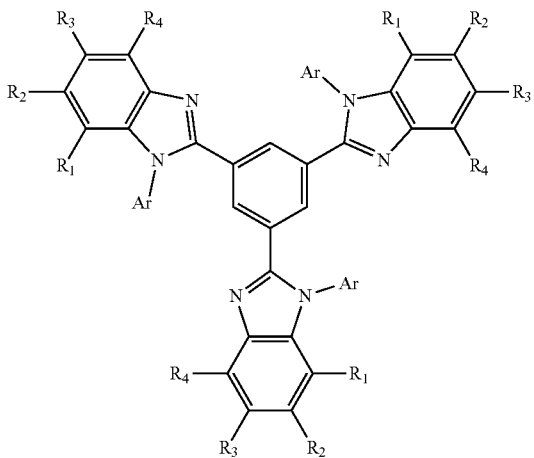

(1)

wherein, in General Formula (1),
Ar is a substituted or unsubstituted aryl group or a substituted or unsubstituted heteroaryl group, and
$R_1$ to $R_4$ are independently a hydrogen atom, a substituted or unsubstituted alkyl group, a substituted or unsubstituted aryl group, or a substituted or unsubstituted heteroaryl group,

[General Formula (2)]

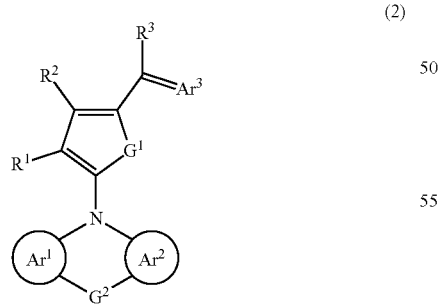

(2)

wherein, in General Formula (2),
$Ar^3$ is a substituted or unsubstituted hydrocarbon cyclic group including two carbonyl groups, or a substituted or unsubstituted heterocyclic group including two carbonyl groups,
$R^1$ to $R^3$ are independently a hydrogen atom, deuterium atom, a substituted or unsubstituted alkyl group having 1 to 30 carbon atoms, an alkoxy group having 1 to 30 carbon atoms, or an aryl group having 6 to 30 carbon atoms, and $R^1$ and $R^2$ are optionally linked to each other to form a ring,
$Ar^1$ and $Ar^2$ are independently a substituted or unsubstituted arylene group having 6 to 30 carbon atoms, or a substituted or unsubstituted heteroarylene group having 3 to 30 carbon atoms, and
$G^1$ and $G^2$ are independently —$(CR_dR_e)_n$—, —Te—, —O—, —S—, —Se—, —$NR_f$—, —$SiR_gR_h$—, —$SiR_{gg}R_{hh}$—, —$GeR_iR_j$—, —$GeR_{ii}R_{jj}$—, —$C(R_m)$=$C(R_n)$—, —$C(R_{mm})$=$C(R_{nn})$—, or a single bond, wherein $R_d$, $R_e$, $R_f$, $R_g$, $R_h$, $R_i$, $R_j$, $R_m$, and $R_n$ are independently a hydrogen atom, a halogen atom, a substituted or unsubstituted alkyl group having 1 to 10 carbon atoms, or a substituted or unsubstituted aryl group having 6 to 10 carbon atoms, $R_{gg}$, $R_{hh}$, $R_{ii}$, $R_{jj}$, $R_{mm}$, and $R_{nn}$ are each independently a substituted or unsubstituted alkyl group having 1 to 10 carbon atoms, or a substituted or unsubstituted aryl group having 6 to 10 carbon atoms, at least one of $R_{gg}$ and $R_{hh}$, $R_{ii}$ and $R_{jj}$, or $R_{mm}$ and $R_{nn}$ is linked to each other to form a ring, and n in —$(CR_dR_e)_n$— is 1 or 2, and
wherein at least one of Ar, $R_1$, $R_2$, $R_3$, or $R_4$ in General Formula (1) is a non-condensed polycyclic aryl group, a condensed polycyclic aryl group, a monocyclic heteroaryl group, or a polycyclic heteroaryl group,
the condensed polycyclic aryl group is a phenanthryl group, a fluorenyl group, an indenyl group, a pyrenyl group, an acetonaftenyl group, a bisphenyl fluorenyl group, or a 9-(9-fluorenyl)fluorenyl group,
the monocyclic heteroaryl group is a pyrrolyl group, a pyrazolyl group, an oxazolyl group, an isooxazolyl group, an oxadiazolyl group, a thiazolyl group, a pyranyl group, a pyrazyl group, a pyrimidinyl group, a pyridazinyl group, a triazinyl group, or an isoquinolyl group, and
the polycyclic heteroaryl group is a benzo(pyridyl)furanyl group, a benzofuranyl group, a benzothienyl group, an indolyl group, a carbonyl group, a phenanthridinyl group, an acridinyl group, a perimidinyl group, a phenanthrolinyl group, a benzooxazolyl group, a quinoxalyl group, a pyrazolyl group, a dibenzofuranyl group, or a dibenzothienyl group.

2. The imaging device of claim 1, wherein the compound represented by General Formula (1) is one of the following compounds:

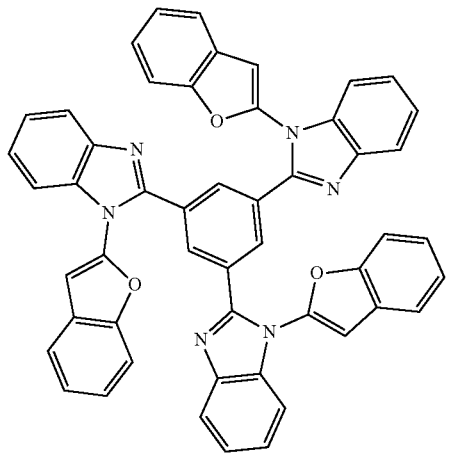

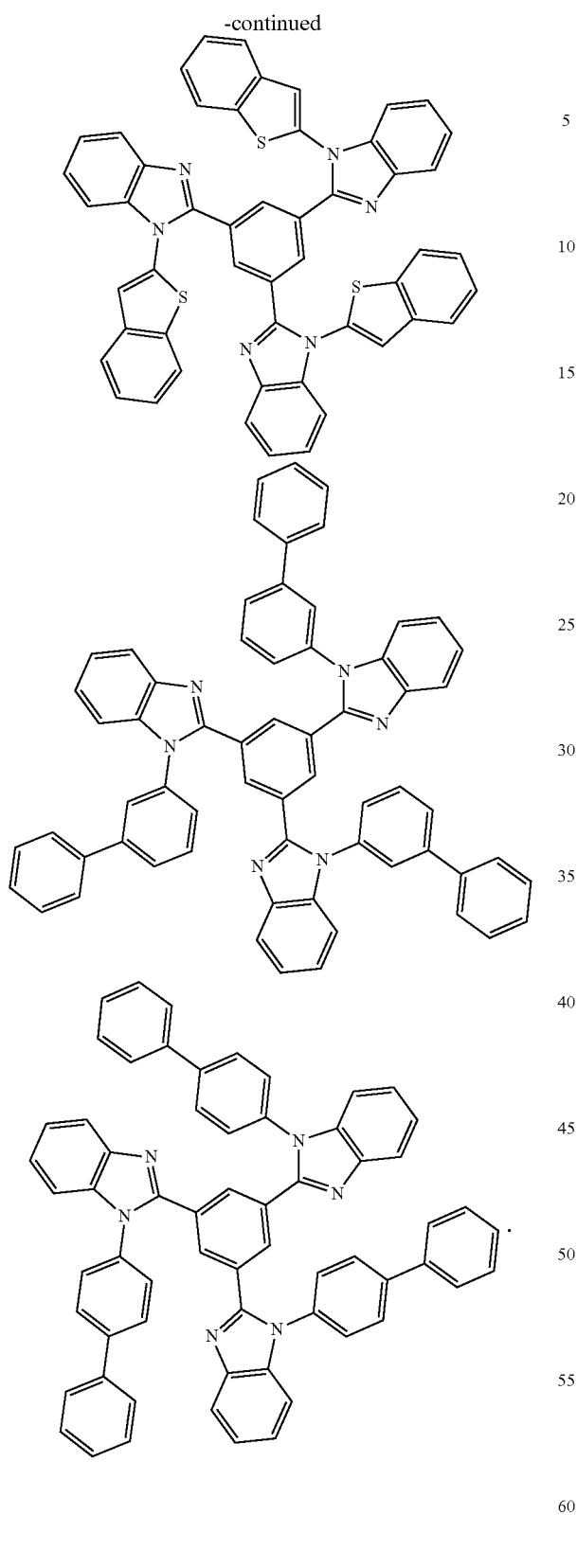
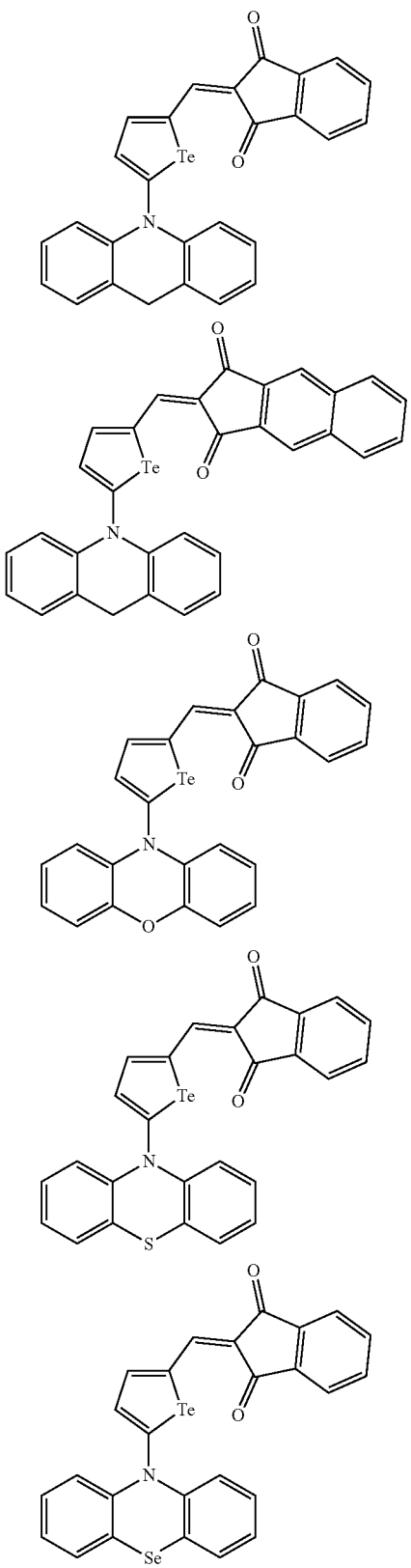
3. The imaging device of claim 1, wherein the compound represented by General Formula (2) is one of the following compounds:

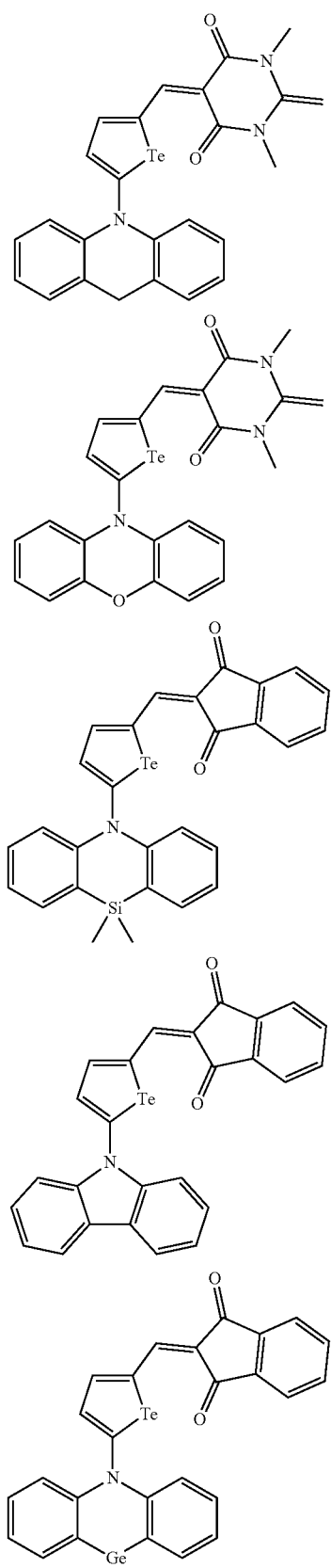
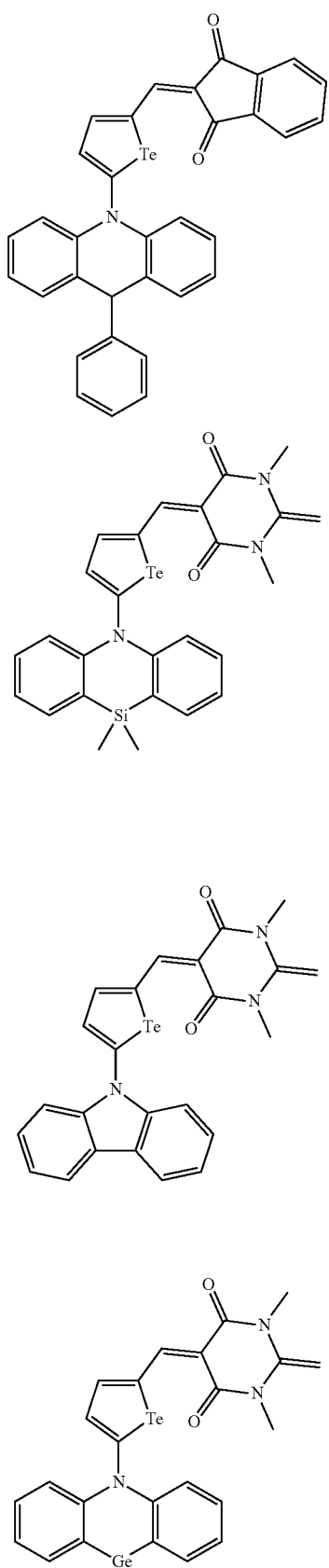

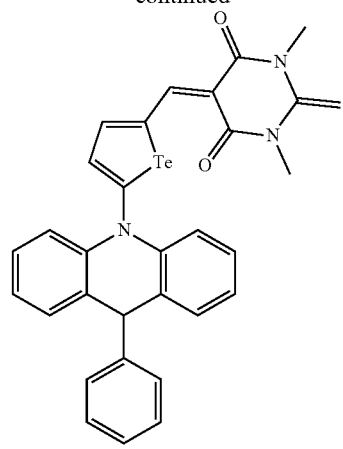
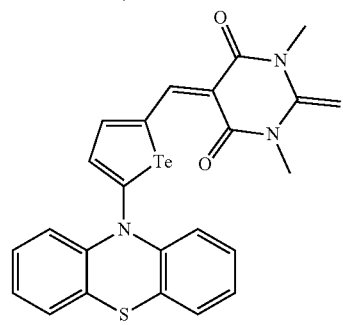
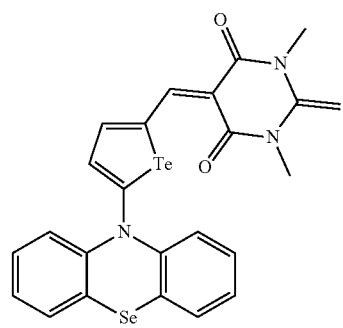
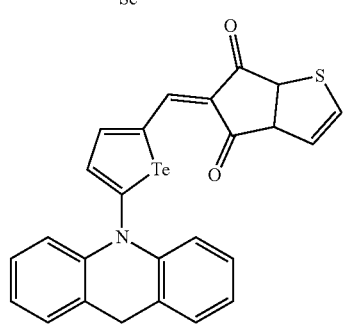
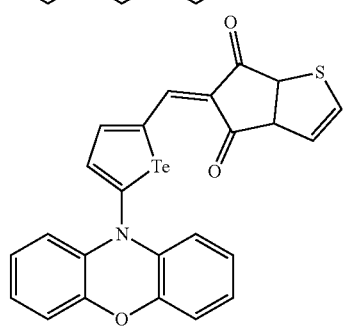
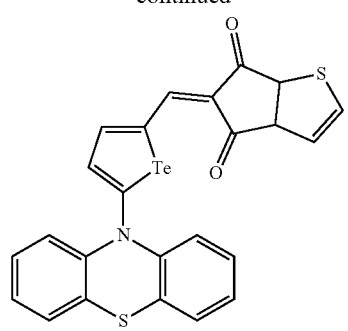
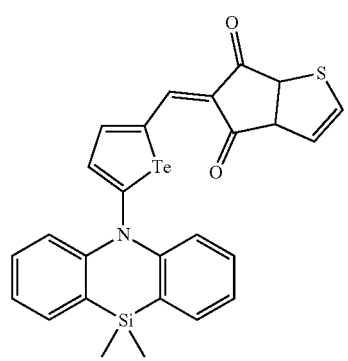
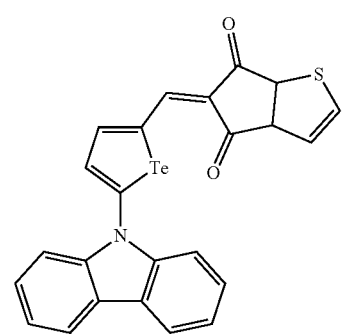
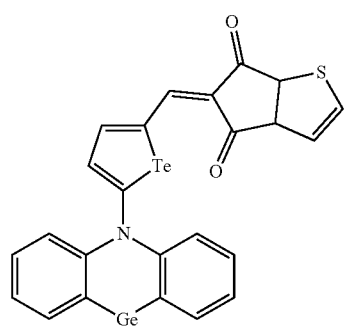

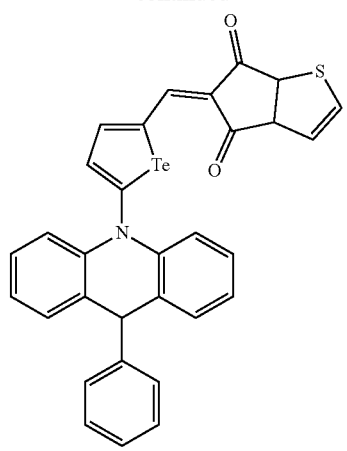
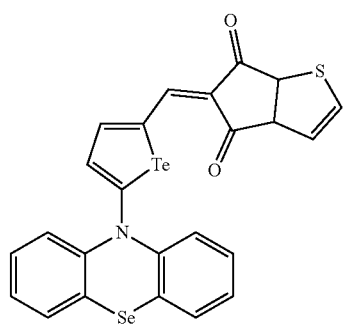
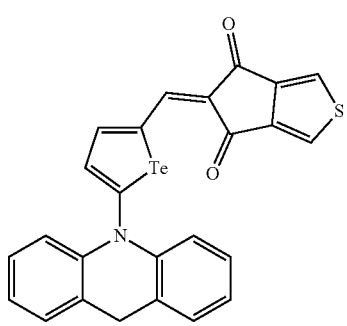
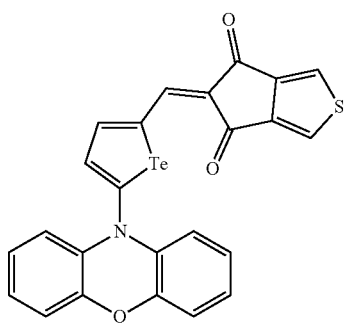
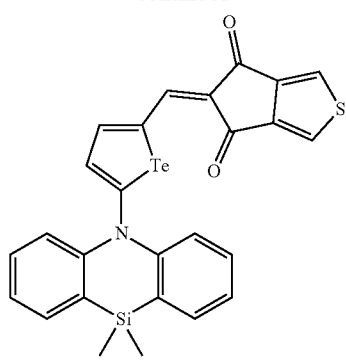
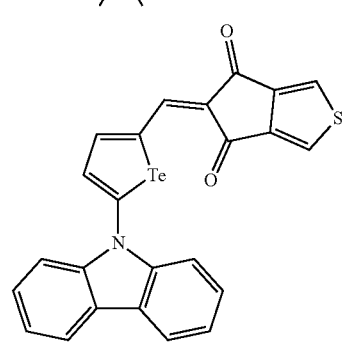
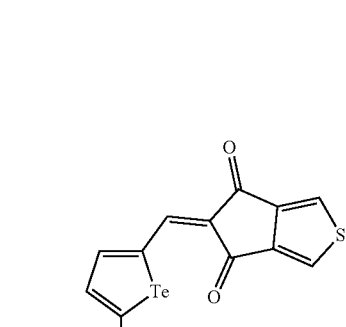
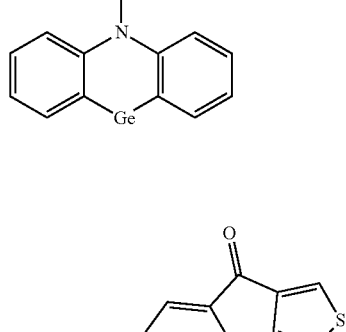
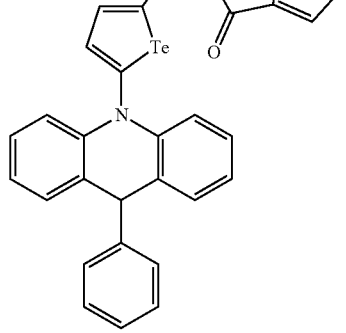

-continued

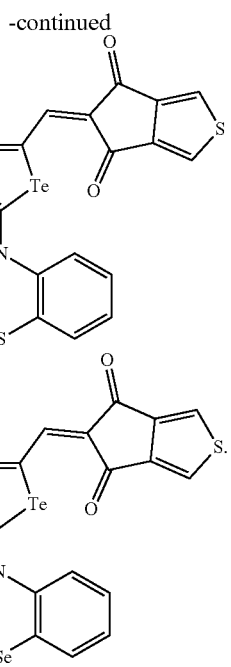

4. The imaging device of claim 1, wherein the compound represented by General Formula (2) is represented by the following chemical formula:

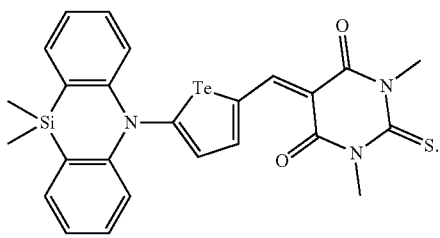

5. The imaging device of claim 1, wherein a thickness of the electron transport buffer layer is greater than or equal to about 1.5 nm and less than about 10 nm.

6. The imaging device of claim 1, wherein, in General Formula (1),
Ar is a substituted aryl group or a substituted or unsubstituted heteroaryl group, and
at least one of $R_1$ to $R_4$ is a substituted or unsubstituted alkyl group, a substituted or unsubstituted aryl group, or a substituted or unsubstituted heteroaryl group.

7. The imaging device of claim 1, further comprising:
a substrate in which a first photosensing device configured to sense light in a blue wavelength region and a second photosensing device configured to sense light in a red wavelength region are integrated,
wherein the photoelectric conversion device is on at least one of the first photosensing device or the second photosensing device such that the photoelectric conversion device overlaps at least one of the first photosensing device or the second photosensing device in a vertical direction extending perpendicular to an upper surface of the substrate, and
the photoelectric conversion device is a first photoelectric conversion device configured to selectively absorb light in a green wavelength region.

8. The imaging device of claim 7, wherein the first photosensing device and the second photosensing device are stacked in the vertical direction extending perpendicular to the upper surface of the substrate.

9. The imaging device of claim 7, further comprising:
a color filter layer between the substrate and the first photoelectric conversion device,
wherein the color filter layer includes a blue filter configured to selectively transmit light in the blue wavelength region, and a red filter configured to selectively transmit light in the red wavelength region,
the blue filter is on the first photosensing device, and
the red filter is on the second photosensing device.

10. The imaging device of claim 7, wherein
the first photosensing device configured to sense light in the blue wavelength region is a second photoelectric conversion device configured to selectively absorb light in the blue wavelength region,
the second photosensing device configured to sense light in the red wavelength region is a third photoelectric conversion device configured to selectively absorb light in the red wavelength region, and
the first photoelectric conversion device, the second photoelectric conversion device, and the third photoelectric conversion device are sequentially stacked and overlap each other in the vertical direction.

11. An imaging apparatus comprising the imaging device of claim 1.

* * * * *